US009832866B2

(12) United States Patent
Ahn et al.

(10) Patent No.: US 9,832,866 B2
(45) Date of Patent: Nov. 28, 2017

(54) MULTILAYERED SUBSTRATE AND METHOD OF MANUFACTURING THE SAME

(71) Applicant: SAMSUNG ELECTRO-MECHANICS CO., LTD., Suwon-si (KR)

(72) Inventors: Seok-Hwan Ahn, Seongnam-si (KR); Mi-Sun Hwang, Suwon-si (KR); Young-Gwan Ko, Seoul (KR); Jong-Seok Bae, Yongin-si (KR); Myung-Sam Kang, Hwaseong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/196,857

(22) Filed: Jun. 29, 2016

(65) Prior Publication Data
US 2016/0381794 A1    Dec. 29, 2016

(30) Foreign Application Priority Data

Jun. 29, 2015  (KR) .................. 10-2015-0092257
Apr. 4, 2016   (KR) .................. 10-2016-0041222
Jun. 29, 2016  (KR) .................. 10-2016-0081510

(51) Int. Cl.
| | | |
|---|---|---|
| *H05K 1/09* | (2006.01) | |
| *H05K 1/02* | (2006.01) | |
| *H05K 3/00* | (2006.01) | |
| *H05K 3/46* | (2006.01) | |
| *H05K 1/11* | (2006.01) | |
| *H05K 3/40* | (2006.01) | |
| *H05K 3/12* | (2006.01) | |

(52) U.S. Cl.
CPC .............. *H05K 1/0298* (2013.01); *H05K 1/09* (2013.01); *H05K 1/115* (2013.01); *H05K 3/007* (2013.01); *H05K 3/0076* (2013.01); *H05K 3/12* (2013.01); *H05K 3/4007* (2013.01); *H05K 3/4623* (2013.01); *H05K 2203/043* (2013.01)

(58) Field of Classification Search
CPC .. H05K 1/00; H05K 1/02; H05K 1/09; H05K 1/11; H05K 1/18; H05K 3/10; H05K 3/34; H05K 3/36; H05K 3/46; H01L 21/02; H01L 21/48; H01L 21/50; H01L 21/67; H01L 23/22; H01L 23/24; H01L 23/48; H01L 23/52
USPC ....... 174/257, 250, 251, 254, 258, 261–264; 361/748, 760, 783, 820; 428/131; 257/687, 700, 711, 720, 737, 774
See application file for complete search history.

(56) References Cited

U.S. PATENT DOCUMENTS 5,321,210 A * 6/1994 Kimbara ............. H01L 21/4857
174/256
5,628,852 A * 5/1997 Ishida ................. H01L 21/4857
156/182
6,026,564 A * 2/2000 Wang ................... H05K 3/3436
174/524

(Continued)

Primary Examiner — Xiaoliang Chen
(74) Attorney, Agent, or Firm — NSIP Law

(57) ABSTRACT

A multilayered substrate includes unit substrates laminated in a direction of thickness thereof, and the unit substrates include a photosensitive insulating layer, a conductive pattern disposed in the photosensitive insulating layer, and a bump penetrating into the photosensitive insulating layer and providing an interlayer connection to the conductive pattern.

7 Claims, 24 Drawing Sheets

(56) References Cited

U.S. PATENT DOCUMENTS

| | | | | |
|---|---|---|---|---|
| 6,310,391 B1* | 10/2001 | Nagasawa | H01L 23/142 | 257/700 |
| 6,335,076 B1* | 1/2002 | Nakamura | H05K 3/462 | 156/60 |
| 2001/0004944 A1* | 6/2001 | Nakamura | H05K 3/3484 | 174/262 |
| 2002/0004180 A1* | 1/2002 | Hotta | G03F 7/0045 | 430/311 |
| 2003/0178229 A1* | 9/2003 | Toyoda | H01L 21/486 | 174/261 |
| 2004/0053489 A1* | 3/2004 | Kata | H01L 21/4857 | 438/622 |
| 2007/0096289 A1* | 5/2007 | Enomoto | H01L 23/5389 | 257/687 |
| 2008/0277776 A1* | 11/2008 | Enomoto | H01L 21/486 | 257/700 |
| 2009/0016671 A1* | 1/2009 | Asai | G02B 6/43 | 385/14 |
| 2009/0046441 A1* | 2/2009 | Funaya | H01L 21/6835 | 361/783 |
| 2009/0231827 A1* | 9/2009 | Furutani | H01L 23/49822 | 361/820 |
| 2010/0126758 A1* | 5/2010 | Akai | H05K 3/384 | 174/257 |
| 2010/0132997 A1* | 6/2010 | Hando | H01L 23/49816 | 174/262 |
| 2010/0139968 A1* | 6/2010 | Takenaka | H01L 23/49822 | 174/263 |
| 2010/0208437 A1* | 8/2010 | Maeda | H01L 21/4857 | 361/760 |
| 2013/0153269 A1* | 6/2013 | Takahashi | H05K 3/368 | 174/254 |
| 2013/0200523 A1* | 8/2013 | Sawachi | H01L 23/5389 | 257/774 |
| 2014/0311771 A1* | 10/2014 | Shimizu | H01L 23/5383 | 174/251 |
| 2014/0361430 A1* | 12/2014 | Ono | H01L 23/49811 | 257/737 |
| 2015/0257256 A1* | 9/2015 | Sato | H05K 1/0269 | 257/774 |
| 2015/0282307 A1* | 10/2015 | Shimizu | H01L 24/13 | 174/264 |
| 2016/0088736 A1* | 3/2016 | Sankman | H05K 1/162 | 361/748 |
| 2016/0155927 A1* | 6/2016 | Kabasawa | G01L 9/0073 | 257/419 |

* cited by examiner

MULTILAYERED SUBSTRATE AND METHOD OF MANUFACTURING THE SAME

CROSS-REFERENCE TO RELATED APPLICATIONS

This application claims the benefit under 35 USC 119(a) of Korean Patent Application Nos. 10-2015-0092257, 10-2016-0041222 and 10-2016-0081510, respectively filed on Jun. 29, 2015, Apr. 4, 2016 and Jun. 29, 2016, in the Korean Intellectual Property Office, the entire disclosure of all of which are incorporated herein by reference.

BACKGROUND

1. Field

The following description relates to a multilayered substrate and a method of manufacturing the multilayered substrate.

2. Description of Related Art

When a multilayered substrate is manufactured, a plurality of build-up layers are successively laminated on a core substrate. Accordingly, the number of laminating processes increases in proportion to the number of layers in the multilayered substrate. During these laminating processes, heat is applied to the portions of the multilayered substrate that are already laminated, increasing the possibility that unpredictable deformations may occur in the multilayered substrate. With an increase in the number of layers required to implement the multilayered substrate, the probability of deformation increases, escalating the difficulty of achieving interlayer alignment.

A related art is described in Korean Patent Publication No. 10-2011-0066044 (laid open on Jun. 16, 2011).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a multilayered substrate involves forming unit substrates and laminating the unit substrates together, and the unit substrates are each formed by: forming a conductive pattern on a carrier; laminating a photosensitive insulating layer on the carrier so as to cover the conductive pattern; forming a bump connected to the conductive pattern by penetrating into the photosensitive insulating layer; and removing the carrier, and the bump includes a solder layer.

The forming of the bump may involve forming an opening in the photosensitive insulating layer at a location corresponding to the bump, and inserting a solder paste into the opening.

The bump further may include a plated layer, and the forming of the bump may involve forming an opening in the photosensitive insulating layer at a location corresponding to the bump; forming the plated layer in the opening; and forming a solder paste on the plated layer.

The general aspect of the method may further involve, after the forming of the bump, laminating a support layer on the photosensitive insulating layer so as to cover the solder paste, and after the removing of the carrier, removing the support layer.

The unit substrates may be laminated together at a temperature higher than or equal to a melting point of the solder layer.

The laminating of the unit substrates together may involve disposing a first metal layer above an uppermost unit substrate among the unit substrates, and laminating the unit substrates and the first metal layer together.

The general aspect of the method may further involve, after the laminating of the unit substrates together, forming a first metal pattern by patterning the first metal layer.

The general aspect of the method may further involve, after the laminating of the unit substrates together: laminating a first insulating layer above the uppermost unit substrate among the unit substrates; laminating a second insulating layer below a lowermost unit substrate among the unit substrates; forming a second metal pattern on the first insulating layer; and forming a third metal pattern on the second insulating layer.

The first insulating layer and the second insulating layer may each include a resin impregnated with a fiber stiffener.

The general aspect of the method may further involve, after the forming of the second metal pattern on the first insulating layer, forming a solder resist on the second metal pattern and the third metal pattern.

The laminating of the unit substrates together may involve: disposing a first metal layer above an uppermost unit substrate among the unit substrates; disposing a first insulating layer below a lowermost unit substrate among the unit substrates; disposing a second metal layer below the first insulating layer; and laminating the unit substrates, the first metal layer, the first insulating layer and the second metal layer together at once.

The general aspect of the method may further involve, after the laminating of the unit substrates together, forming a first metal pattern and a second metal pattern by patterning the first metal layer and the second metal layer, respectively, and a via connected with the second metal pattern may be formed in the first insulating layer.

The general aspect of the method may further involve, after the forming of the first metal pattern and the second metal pattern, forming a solder resist on the first metal pattern and the second metal pattern.

In another general aspect, a method of manufacturing a multilayered substrate involves forming unit substrates and laminating the unit substrates together, and the unit substrates are each formed by: forming a conductive pattern on a carrier; forming a bump on the conductive pattern; laminating a photosensitive insulating layer on the carrier so as to expose the bump; and removing the carrier, and the bump includes a solder layer.

The forming of the bump may involve disposing a mask on the conductive pattern, the mask having a hole formed therein, the hole corresponding to a location of the bump; inserting a solder paste into the hole; and removing the mask.

The forming of the bump may involve laminating a photo resist on the conductive pattern, forming an opening area on the photo resist, the opening area corresponding to a location of the bump, inserting a solder paste into the opening area; and removing the photo resist.

In yet another general aspect, a multilayered substrate includes unit substrates laminated in a direction of thickness thereof, and the unit substrates each include a photosensitive insulating layer, a conductive pattern disposed in the photosensitive insulating layer, and a bump penetrating into the photosensitive insulating layer and providing an interlayer connection to the conductive pattern. The bump includes a solder layer.

The bump may further include a copper layer, and the solder layer may be disposed on the copper layer.

The conductive pattern may be embedded along one surface of the photosensitive insulating layer.

The general aspect of the multilayered substrate may further include a first metal pattern disposed above an uppermost unit substrate of the unit substrates, a first insulating layer laminated below a lowermost unit substrate of the unit substrates; a second metal pattern disposed on a lower surface of the first insulating layer; and a via disposed in the first insulating layer and connecting the conductive pattern with the second metal pattern.

The first insulating layer may include a photosensitive resin, and the via and the bump includes a same material.

The general aspect of the multilayered substrate may further include a solder resist disposed on the first metal pattern and the second metal pattern.

The general aspect of the multilayered substrate may further include a second insulating layer disposed above the uppermost unit substrate and covering the first metal pattern; and a third metal pattern disposed on the second insulating layer.

The first insulating layer and the second insulating layer may each include a resin impregnated with a fiber stiffener.

The general aspect of the multilayered substrate may further include a solder resist disposed on the second metal pattern or the third metal pattern.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
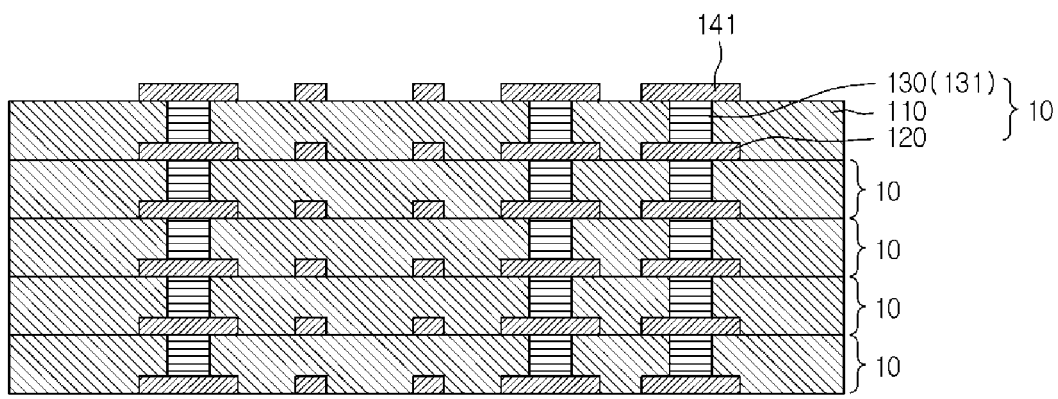
FIG. 1 illustrates an example of a multilayered substrate.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless otherwise defined, all terms, including technical terms and scientific terms, used herein have the same meaning as how they are generally understood by those of ordinary skill in the art to which the present disclosure pertains. Any term that is defined in a general dictionary shall be construed to have the same meaning in the context of the relevant art, and, unless otherwise defined explicitly, shall not be interpreted to have an idealistic or excessively formalistic meaning.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

Hereinafter, certain embodiments of the present disclosure will be described in detail with reference to the accompanying drawings.

Multilayered Substrate

FIG. 1 illustrates an example of a multilayered substrate.

Referring to FIG. 1, a multilayered substrate 100 includes a plurality of unit substrates 10 laminated in a thickness direction of the multilayered substrate 100.

The plurality of unit substrates 10 each include a photosensitive insulating layer 110, a conductive pattern 120 and a bump 130.

The photosensitive insulating layer 110 is a resin layer made of a material reactive to light. For example, the photosensitive insulating layer 110 may include a photocurable resin. According to one example, the hardness of the photosensitive insulating layer 110 may be adjusted by applying light. In this example, the photosensitive insulating layer 110 may also have a thermosetting property, and thus the hardness thereof may be adjusted by adjusting the amount of heat and light applied to the photosensitive insulating layers 110.

By using a photosensitive insulating layer 110 to obtain the unit substrates 10, it becomes possible to utilize photolithography processes, such as exposure and developing processes, to form the unit substrates 10, without the use of a photo resist R. Further, the use of photosensitive insulating layers 110 makes it easier to realize a fine hole by using a photo process in a photosensitive insulating layer, in comparison to a method in which the holes are formed by using a laser in a prepreg. Moreover, when a laser is used to form a plurality of holes, a plurality of laser processes are required to form each holes. However, with the photolithographic process, only a single process is required to form a plurality of holes, thereby simplifying the process of manufacturing the unit substrates 10.

Moreover, in comparison to a laser process, a greater variety of hole shapes may be easily obtained by utilizing a photolithography process.

The photosensitive insulating layer 110 may be a positive type or a negative type photosensitive layer.

When a positive type photosensitive insulating layer 110 is used to manufacturing a unit substrate 10, during an exposure process, the photopolymer coupling is broken at a portion of the layer where light is applied. During a subsequent developing process, the portion at which the photopolymer coupling is broken by light is removed.

When a negative type photosensitive insulating layer 110 is used to manufacturing a unit substrate 10, during an exposure process, a photopolymerization occurs at a portion of the layer where light is applied. That is, a photopolymer having a linear structure may be transformed into a three-dimensional network structure by applying light. When a developing process is subsequently carried out, the portion where the light is not applied is removed.

According to one example, the photosensitive insulating layer 110 may be a resin layer that includes an inorganic filler. The addition of an inorganic filler to the resin layer enhances a rigidity of the photosensitive insulating layer 110.

Examples of materials used as inorganic fillers include, for example, at least one selected from the group consisting of silica ($SiO_2$), alumina ($Al_2O_3$), silicon carbide (SiC), barium sulfate ($BaSO_4$), talc, clay, mica powder, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and calcium zirconate ($CaZrO_3$).

The conductive pattern 120 may be, for example, a circuit pattern formed on a printed circuit board for transferring a signal or may be a coil pattern formed inside an inductor for generating inductance.

Referring to FIG. 1, a conductive pattern 120 is installed within the photosensitive insulating layer 110. Some conductive patterns 120 are installed on a surface of the photosensitive insulating layer 110. The conductive patterns 120 installed within a photosensitive insulating layer 110 may be formed along a lower side of the photosensitive insulating layer 110 in such a way that one surface of the conductive pattern 120 is exposed from the photosensitive insulating layer 110.

In this example, the orientation of being "upper" and "lower" is based on taking any one side of the unit substrate as an "upper" side and the other side thereof as a "lower" side, and does not refer to an orientation of absolute upper and lower positions.

The conductive pattern 120 may be formed using, but not limited to, at least one of various processes such as, an additive process, a subtractive process, a semi-additive process, a tenting process, a modified semi-additive process and the like.

The conductive pattern 120 may be made of copper (Cu), silver (Ag), palladium (Pd), aluminum (Al), nickel (Ni), titanium (Ti), gold (Au) or platinum (Pt), which has excellent electrical properties.

The conductive pattern 120 is formed on each of the plurality of unit substrates 10. The shapes of the conductive patterns 120 formed on the plurality of unit substrates 10 may be identical with one another or be different from one another.

The bump 130 penetrates the photosensitive insulating layer 110 in order to provide an interlayer electrical connection between conductive patterns 120 formed at different layers, respectively. In other words, the bump 130 is formed inside the photosensitive insulating layer 110 and is in contact with the conductive patterns 120 for interlayer connection of the conductive patterns 120. In this example, the bump 130 may be formed on an upper surface of the conductive pattern 120.

The bump 130 may include a solder layer 131. In the example illustrated in FIG. 1, the bump 130 is formed entirely of a solder layer 131. Accordingly, the bump 130 itself is formed entirely of a solder material.

In this example, "solder" refers to a metallic material that may be used for soldering. The solder may be an alloy containing lead (Pb), but it is also possible that the solder does not contain lead. For instance, the solder may be tin (Sn), silver (Ag), copper (Cu) or an alloy of metals selected from tin (Sn), silver (Ag) and copper (Cu). According to one example, the solder may be an alloy of tin, silver and copper with a tin content of 90% or more.

With the conductive pattern 120 installed in the lower side of the photosensitive insulating layer 110, the bump 130 may penetrate the photosensitive insulating layer 110 such that the bump 130 is placed above the conductive pattern 120.

With a plurality of photosensitive insulating layers 110, the bumps 130 formed on the plurality of photosensitive insulating layers 110, respectively, may be aligned in a straight line through the entire layers. In other words, the bumps 130 may be arranged on top of each other to form a stacked structure throughout the entire layers.

Moreover, the bumps 130 may each have the shape of a column, which has a constant width and a constant latitudinal cross section from a top to a bottom thereof. Owing to this shape, the bump 130 may be referred to as a "post" or a "pillar." However, the shape of the bump 130 is not necessarily restricted to what is described herein. For example, a longitudinal cross-section of the bump 130 may have the shape of a trapezoid or an inverse trapezoid.

Referring to FIG. 1, the multilayered substrate 100 further includes a first metal pattern 141.

The first metal pattern 141 is a pattern made of a metallic material that is formed above the unit substrate 10 positioned at an uppermost layer of the plurality of unit substrates 10. The first metal pattern 141 may be functionally similar or identical with the conductive pattern 120 described above, but the term "metal pattern" is used herein in order to distinguish the first metal pattern 141 from the conductive patterns 120 buried within the photosensitive insulating layers 110.

Unlike the conductive pattern 120 being buried in the photosensitive insulating layer 110, the first metal pattern 141 protrudes from the photosensitive insulating layer 110.

The first metal pattern 141 may be electrically connected to the bump 130 and may be formed in contact with the bump 130.

Like the conductive pattern 120, the first metal pattern 141 may be formed by, but not limited to, at least one of various processes such as an additive process, a subtractive process, a semi-additive process, a tenting process and a modified semi-additive process.

The first metal pattern 141 may be made of copper (Cu), silver (Ag), palladium (Pd), aluminum (Al), nickel (Ni), titanium (Ti), gold (Au) or platinum (Pt).

Figure 2:
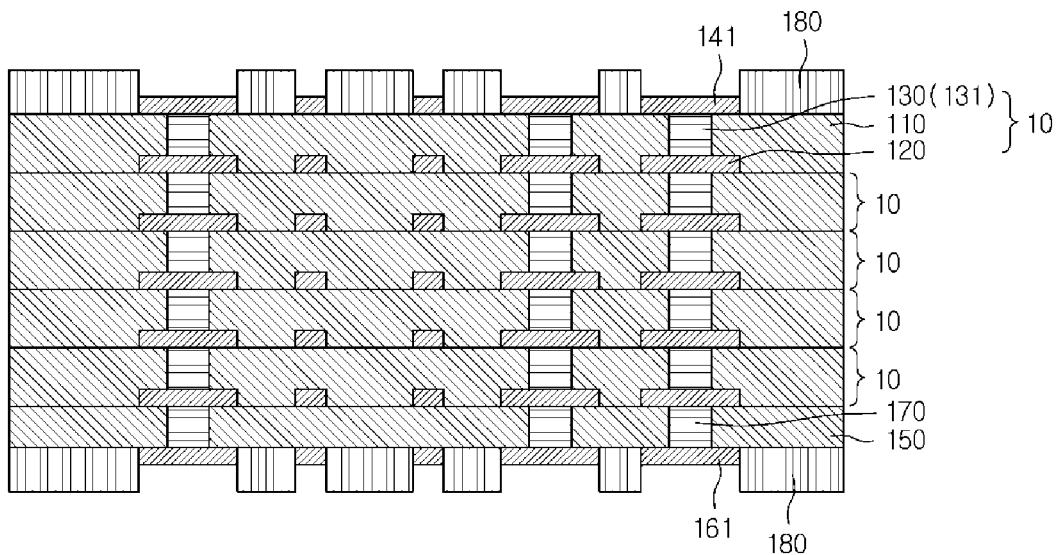
FIG. 2 illustrates another example of a multilayered substrate.

FIG. 2 illustrates another example of a multilayered substrate.

Referring to FIG. 2, a multilayered substrate 100 includes a plurality of unit substrates 10 laminated in a direction of thickness thereof.

According to this example, the plurality of unit substrates 10 each include a photosensitive insulating layer 110, a conductive pattern 120 and a bump 130.

As described with respect to FIG. 1, a photosensitive insulating layer 110 may be an insulating layer having a photosensitive property, and the conductive pattern 120 is formed within the photosensitive insulating layer 110. The bump 130 penetrates the photosensitive insulating layer 110 in order to provide an interlayer electrical connection between conductive patterns 120 formed at different layers, respectively. Moreover, the bump 130 includes a solder layer 131.

The multilayered substrate 100 further includes a first metal pattern 141, a first insulating layer 150, a second metal pattern 161, a via 170 and a solder resist 180.

The first metal pattern 141 may be identical with the first metal pattern 141 that has been described above with reference to FIG. 1.

The first insulating layer 150 is a resin layer formed below a unit substrate that is placed at a lowermost layer among the plurality of unit substrates 10. In the multilayered substrate 100 in accordance FIG. 2, the first insulating layer 150 may be a photosensitive resin. According to one example, the first insulating layer 150 may be made of a same material as that of the photosensitive insulating layer 110. The photosensitive property of a suitable photosensitive material has been described above and thus will not be described redundantly herein.

The first insulating layer 150 may have a same thickness as that of the photosensitive insulating layer 110. However, the first insulating layer 150 does not have the conductive pattern 120 installed therein and has the second metal pattern 161 protruding therefrom.

That is, in the multilayered substrate 100 illustrated in FIG. 2, a conductive pattern 120 is installed in each photosensitive insulating layer 110, and the first metal pattern 141 and the second metal pattern 161 protrude, respectively, from the uppermost photosensitive insulating layer 110 and the first insulating layer 150, the first insulating layer 150 being disposed at the lowermost photosensitive insulating layer 110.

As described earlier, the second metal pattern 161 is a pattern made of a metallic material that is formed on a lower surface of the first insulating layer 150 such that the second metal pattern 161 protrudes from the first insulating layer 150.

Like the first metal pattern 141, the second metal pattern 161 may be formed using, but not limited to, at least one of various processes such as, for example, an additive process, a subtractive process, a semi-additive process, a tenting process and a modified semi-additive process.

Moreover, the second metal pattern 161 may be made of copper (Cu), silver (Ag), palladium (Pd), aluminum (Al), nickel (Ni), titanium (Ti), gold (Au) or platinum (Pt).

The via 170 is formed to penetrate the first insulating layer 150 so as to be connected with the second metal pattern 161. The via 170 may be formed on the second metal pattern 161. The via 170 may be made of a same material as that of the bump 130.

That is, the via 170 includes the solder layer 131 and may be entirely made of a solder material. As described earlier, the solder may be an alloy containing lead (Pb), but the solder may possibly be tin (Sn), silver (Ag), copper (Cu) or an alloy of metals selected from tin (Sn), silver (Ag) and copper (Cu), without lead (Pb).

Moreover, like the bump 130 described earlier, the via 170 may have the shape of a column, which has a constant width and a constant latitudinal cross section from a top to a bottom thereof.

In this example, the solder resist 180 is formed on the first metal pattern 141 and on the second metal pattern 161. After the solder resist 180 is coated to cover the first metal pattern 141 and the second metal pattern 161 entirely, portions of the solder resist 180 are removed to prepare the first metal pattern 141 and the second metal pattern 161 to function as pads.

A connector, such as a solder ball, may be formed at exposed portions of the first metal pattern 141 and the second metal pattern 161 to allow the multilayered substrate 100 to be electrically connected with an external device such as an electronic component and/or a mainboard.

In an example in which a solder resist 180 having a photosensitive property is utilized, a photolithography process may be used to expose the portions of the first metal pattern 141 and the second metal pattern 161 from the solder resist 180.

Figure 3:
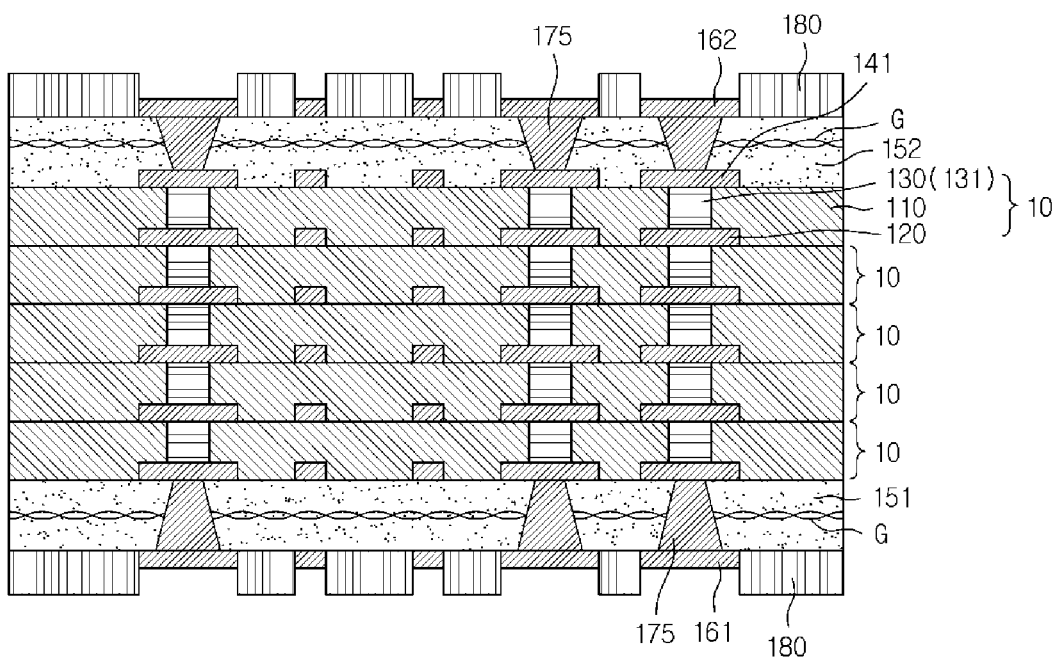
FIG. 3 illustrates another example of a multilayered substrate.

FIG. 3 illustrates another example of a multilayered substrate.

Referring to FIG. 3, a multilayered substrate 100 includes a plurality of unit substrates 10 laminated in a direction of thickness thereof.

The plurality of unit substrates 10 each includes a photosensitive insulating layer 110, a conductive pattern 120 and a bump 130. Moreover, the example of the multilayered substrate 100 according to FIG. 3 further includes a first metal pattern 141, a first insulating layer 151, a second insulating layer 152, a second metal pattern 161, a third metal pattern 162, a via 175 and a solder resist 180.

The first metal pattern 141 is identical with what has been described above with reference to FIG. 1.

In the multilayered substrate 100 illustrated in FIG. 3, the first insulating layer 151 is mainly made of a resin and formed below a unit substrate that is placed below the lowermost unit substrate 10. The first insulating layer 151 has a greater thickness than a single photosensitive insulating layer 110.

The second insulating layer 152 is mainly made of a resin and formed above the uppermost unit substrate 10 among the plurality of unit substrates 10.

Accordingly, in the multilayered substrate 100, the first insulating layer 151 and the second insulating layer 152 may be laminated, respectively, on outermost layers of the plurality of the unit substrates 10.

The first insulating layer 151 and the second insulating layer 152 may be made of a thermosetting resin such as an epoxy resin, a thermoplastic resin such as polyimide, or a photocurable resin.

The epoxy resin may be, but not limited to, for example, naphthalene epoxy resin, bisphenol A type epoxy resin, bisphenol F type epoxy resin, novolak epoxy resin, cresol novolak epoxy resin, rubber modified epoxy resin, ring-type aliphatic epoxy resin, silicon epoxy resin, nitrogen epoxy resin or phosphor epoxy resin.

The first insulating layer 151 and the second insulating layer 152 may each be a resin impregnated with a stiffener G. The stiffener G may be fiber stiffener. The fiber stiffener may be fiberglass, which may be distinguished into glass filament, glass fiber and glass fabric, depending on a thickness thereof. In this example, any one of glass filament, glass fiber and glass fabric may be used as the stiffener G. An insulating layers 151, 152 having fiberglass impregnated therein as the stiffener G may be made of, for example, a prepreg (PPG).

The first insulating layer 151 and the second insulating layer 152 made of resin having the stiffener G impregnated therein may improve the rigidity of the multilayered substrate 100.

The second metal pattern 161 is a pattern made of a metallic material that is formed on a lower surface of the first insulating layer 151, which is formed below the unit substrate at the lowermost layer among the plurality of unit substrates 10. The second metal pattern 161 has been described earlier with reference to FIG. 2.

The third metal pattern 162 is a pattern made of a metallic material that is formed on an upper surface of the second insulating layer 152, which is formed above the uppermost unit substrate among the plurality of unit substrates 10.

Like the first metal pattern 141 and the second metal pattern 161, the third metal pattern 162 may be formed using, but not limited to, at least one of various processes such as, for example, an additive process, a subtractive process, a semi-additive process, a tenting process and a modified semi-additive process.

Moreover, the third metal pattern 162 may be made of copper (Cu), silver (Ag), palladium (Pd), aluminum (Al), nickel (Ni), titanium (Ti), gold (Au) or platinum (Pt).

In this example, the first metal pattern 141 is covered by the first insulating layer 151 and thus is not exposed to an outside. However, the second metal pattern 161 and the third metal pattern 162 are formed on an outside surface of the first insulating layer 151 and the second insulating layer 152, respectively, and thus are exposed from the first and second insulating layers 151, 152.

The via 175 is formed by penetrating into the first insulating layer 151 so as to connect the second metal pattern 161 with the conductive pattern 120 or by penetrating into the second insulating layer 152 so as to connect the first metal pattern 141 with the third metal pattern 162.

The via 175 may be fabricated by forming a via hole in the first insulating layer 151 and the second insulating layer 152 and then having a conductive material formed within the via hole. The via hole may be machined using a laser drill and filled with a plating material such as, for example, copper. If necessary, the conductive material may be formed on an inner wall of the via hole only, leaving a portion of the via hole void.

Unlike the bump 130, which has the shape of a column having a constant width from a top to a bottom thereof, the via 175 may have the shape of a trapezoid, of which a width and a latitudinal cross-sectional area are increased from an inside to an outside of the multilayered substrate 100.

The solder resist 180 is formed on an outside surface of the first insulating layer 151 and on an outside surface of the second insulating layer 152, and is formed on the second metal pattern 161 and on the third metal pattern 162.

After the solder resist 180 is coated to cover the second metal pattern 161 and the third metal pattern 162 entirely, portions of the solder resist 180 are removed to prepare the second metal pattern 161 and the third metal pattern 162 to function as pads.

A connector, such as a solder ball, may be subsequently formed at exposed portions of the second metal pattern 161 and the third metal pattern 162 to allow the multilayered substrate 100 to be electrically connected with an external device such as an electronic component and/or a mainboard.

In an example in which the solder resist 180 has a photosensitive property, a photolithography process may be used to expose the portions of the second metal pattern 161 and the third metal pattern 162 from the solder resist 180.

Figure 4:
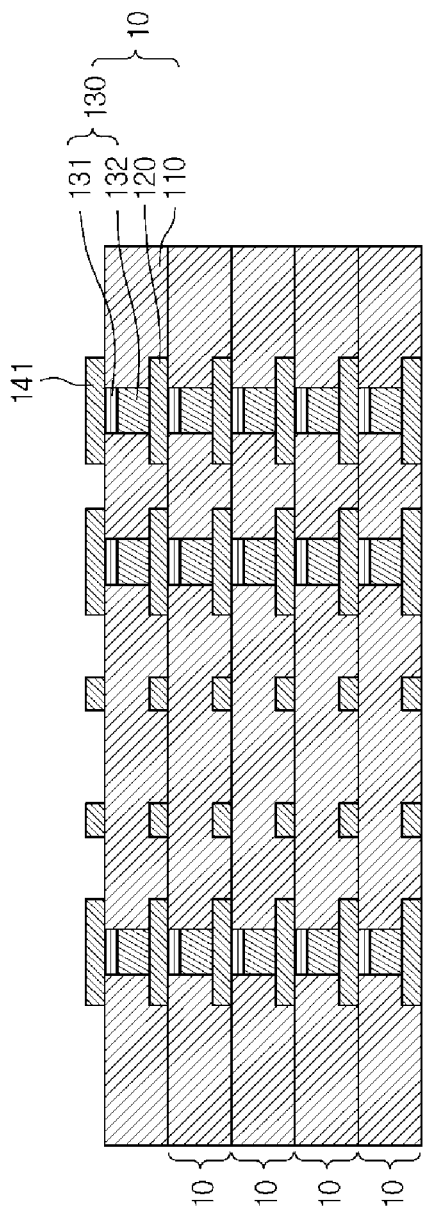
FIG. 4 illustrates yet another example of a multilayered substrate.

FIG. 4 illustrates yet another example of a multilayered substrate.

Referring to FIG. 4, a multilayered substrate 100 includes a plurality of unit substrates 10 laminated in a direction of thickness thereof.

The plurality of unit substrates 10 each include a photosensitive insulating layer 110, a conductive pattern 120 and a bump 130. Moreover, the bump 130 includes a solder layer 131 and a copper layer 132. In this example, the solder layer 131 is formed on the copper layer 132. In other words, the bump 130 has a double layer structure including the copper layer 132 and the solder layer 131.

Referring to FIG. 4, the multilayered substrate 100 further includes a first metal pattern 141. Although not illustrated in FIG. 4, in another example, the multilayered substrate 100 may further include the afore-described first insulating layer 151, second insulating layer 152, second metal pattern 161, third metal pattern 162 and solder resist 180.

Figure 5:
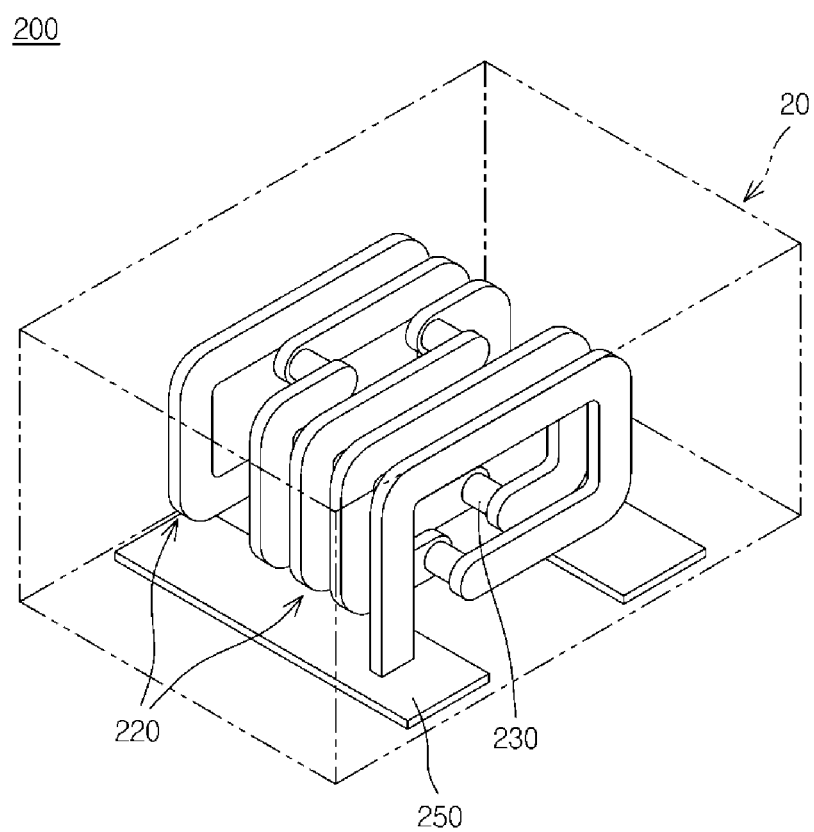
FIG. 5 illustrates an example of an inductor implemented as a multilayered substrate.
Figure 6:
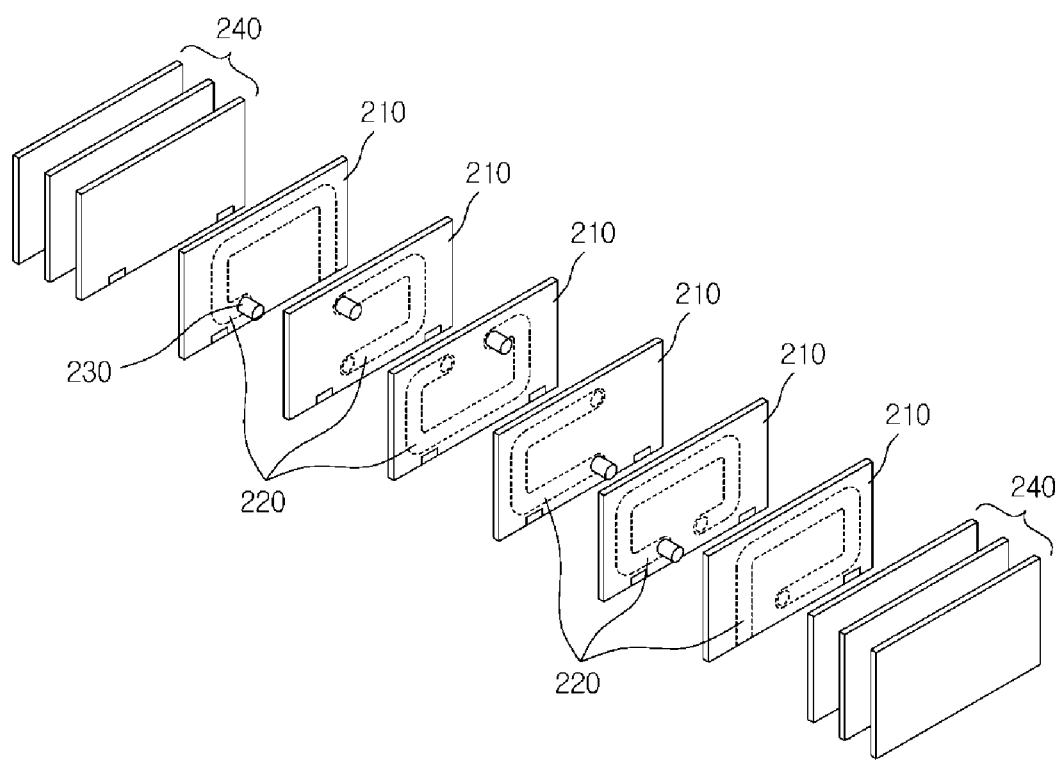
FIG. 6 illustrates an exploded perspective view of layers of the inductor illustrated in FIG. 5.

FIGS. 5 and 6 illustrate an example of an inductor that is implemented by a multilayered substrate 100 in accordance with the examples provided above.

Referring to FIG. 5, an inductor 200 includes a laminate 20 and an external electrode 250. The laminate 20 is formed from a plurality of unit substrates. Each of the plurality of unit substrates includes a photosensitive insulating layer 210, a conductive pattern 220 and a bump 230. The laminate 20 further includes cover layers 240.

The laminate 20 of the inductor illustrated in FIG. 5 may be implemented as a multilayered substrate 100 described with reference to FIG. 1, for example.

The conductive pattern 220 functions as a coil pattern generating inductance in the inductor, and the conductive pattern 220 may be formed to have a same rotation direction on each layer. The conductive pattern 220 may be formed to be buried in the photosensitive insulating layer 210.

Referring to FIG. 6, a conductive pattern 220 forms an interlayer electrical connection with another conductive pattern 220 through a bump 230, of which description is identical with the descriptions provided with reference to FIGS. 1 to 4.

The cover layers 240 are insulating layers that do not have the conductive pattern 220 contained therein. The cover layers 240 may be formed of a material that has a photosensitive property. Referring to FIG. 6, the cover layers 240 are laminated on outermost layers among the plurality of unit substrates. A plurality of cover layers 240 may be provided, and a dummy pattern may be formed in the cover layers 240.

The dummy pattern may extend to the photosensitive insulating layer 210 but may be formed at a boundary of the photosensitive insulating layer 210 in order to prevent the dummy pattern from overlapping with the conductive pattern 220. According to one example, the dummy pattern may be arranged on top of each other in a stacked structure throughout the layers in the entire laminate 20.

The external electrode 250 may be formed on a surface of the laminate 20 for electric connection with the conductive pattern 220.

The external electrode 250 may be formed on one surface of the laminate 20 or may be formed on one surface and extended to a lateral surface of the laminate 20, but a location of the external electrode 250 may not be limited to what is described and illustrated herein.

Method Of Manufacturing A Multilayered Substrate

FIGS. 7 to 21C illustrate examples of methods of manufacturing a multilayered substrate. Referring to FIGS. 7 to 21C, an example of a method of manufacturing a multilayered substrate involves forming a plurality of unit substrates and laminating the plurality of unit substrates en bloc.

Forming a plurality of unit substrates 10 involves forming a unit substrate 10 multiple times. Each unit substrate 10 thus formed may include a photosensitive insulating layer 110, a conductive pattern 120 and a bump 130.

The conductive pattern 120 of each unit substrate 10 may be formed identically or differently on every layer. In the event that the conductive pattern 120 is formed with a different pattern on every layer, a few patterns may be repeatedly formed. The bump 130 may include a solder layer 131.

Laminating the plurality of unit substrates 10 en bloc involves laminating the entire plurality of unit substrates 10 at once to join the plurality of unit substrates 10 into a structure. During the lamination process in which the plurality of unit substrates 10 are laminated en bloc, a first metal layer 140 (and a second metal layer 160) may be laminated together with the plurality of unit substrates 10.

When the plurality of units substrates 10 are laminated en bloc, neighboring unit substrates 10 may be pressed to and joined with one another using a laminator, which may be V-Press, and the plurality of unit substrates 10 may be vacuum pressed.

The lamination may be performed at a temperature between about 180° C. and 200° C. In this example, a solder of the solder layer 131 of the bump 130 may be made of an alloy of tin, silver and copper with a tin content of 90% or more, and the above temperature may be a melting point of the solder layer 131 of the bump 130, and thus the unit substrates 10 may be joined with one another as the solder is melted at the above temperature.

Moreover, in the event that the solder of the solder layer 131 is made of tin only, the melting point of tin is about 230° C. Accordingly, the en bloc lamination may be performed at a temperature of about 230° C. or higher.

As a result of the en bloc lamination, an intermetallic compound (IMC) layer may be formed between the solder layer 131 and the conductive pattern 120. In an example in which the bump 130 includes the solder layer 131 and a copper layer 132, the IMC layer may be also formed between the solder layer 131 and the copper layer 132.

By using the en bloc lamination process to join multiple unit substrates at once, alignment precision in the final product may be improved in comparison to a method in which a multilayered substrate is obtained by successively laminating unit substrates. This is because providing a high-temperature, high-pressure environment only once during the manufacturing process of a multilayered substrate results in a multilayered substrate that has a relatively smaller warpage as well as causes a relatively smaller deviation in thickness in the photosensitive insulating layers in the laminated structure. Moreover, while an alignment error is prone to occur every time a layer is laminated when the multilayered substrate is formed by successively laminating the unit substrates, only a single occurrence of error is reflected when the unit substrates are each formed and laminated together at once.

Meanwhile, because the multilayered substrate is completed through a single process, it is possible to save costs and a lead time.

Hereinafter, examples of processes of forming the plurality of unit substrates and laminating the unit substrates en bloc will be described in detail.

Figure 7:
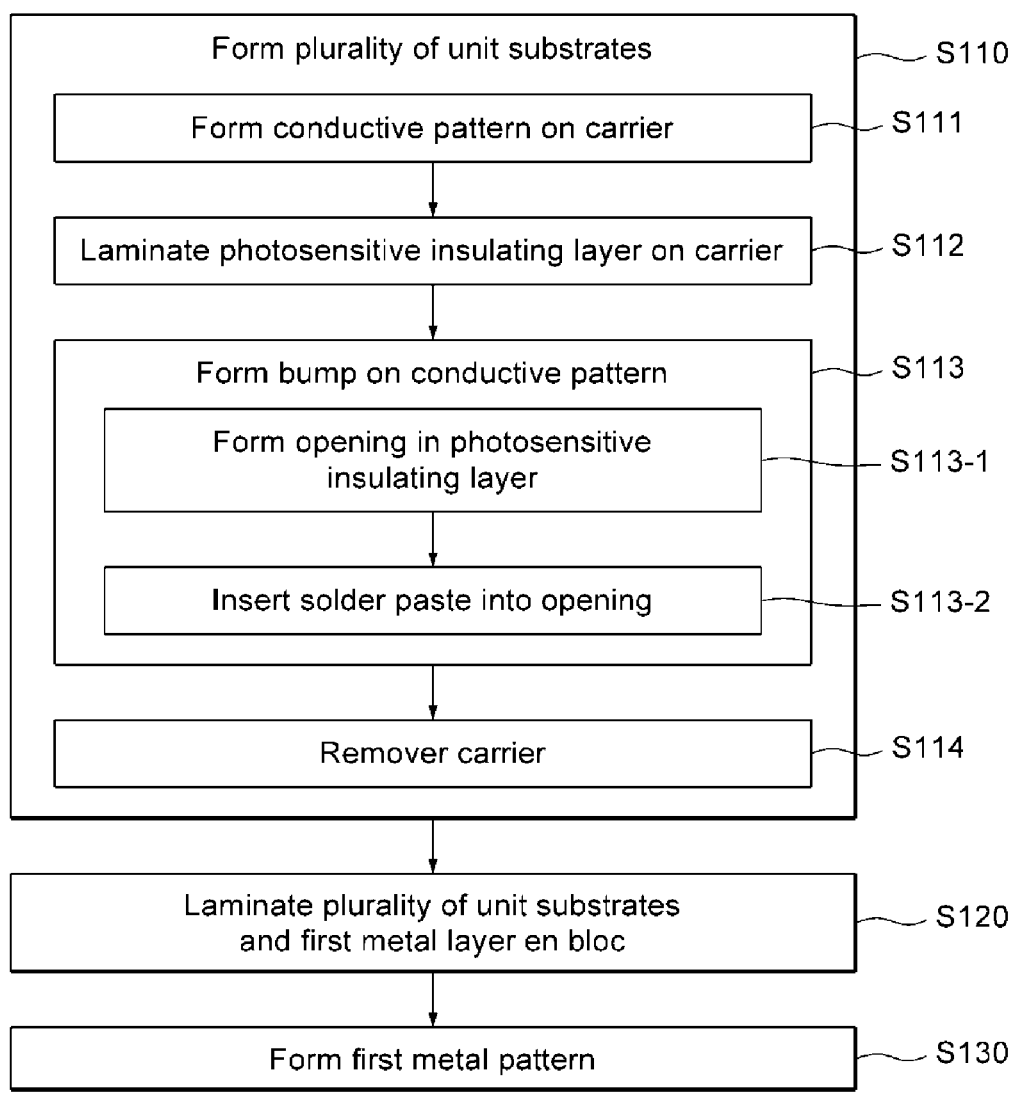
FIG. 7 is a flow diagram illustrating an example of a method of manufacturing a multilayered substrate

FIG. 7 is a flow diagram illustrating an example of a method of manufacturing a multilayered substrate.

Referring to FIG. 7, the method of manufacturing a multilayered substrate involves forming a plurality of unit substrates (S110) and laminating the plurality of unit substrates en bloc, and the process of laminating the plurality of units substrates en bloc includes laminating the plurality of unit substrates and a first metal layer en bloc (S120). Moreover, the example of the method of manufacturing a multilayered substrate illustrated in FIG. 7 further involves forming a first metal pattern by patterning the first metal layer (S130).

Referring to FIG. 7, the process of forming a plurality of unit substrates (S110) involves forming a conductive pattern on a carrier (S111), laminating a photosensitive insulating layer on the carrier (S112), forming a bump on the conductive pattern (S113) and removing the carrier (S114).

The process of forming the bump on the conductive pattern (S113) involves forming an opening in the photosensitive insulating layer (S113-1) and inserting solder paste into the opening (S113-2).

Hereinafter, an example of the process of forming a plurality of unit substrates (S110) will be described.

Figure 8A:
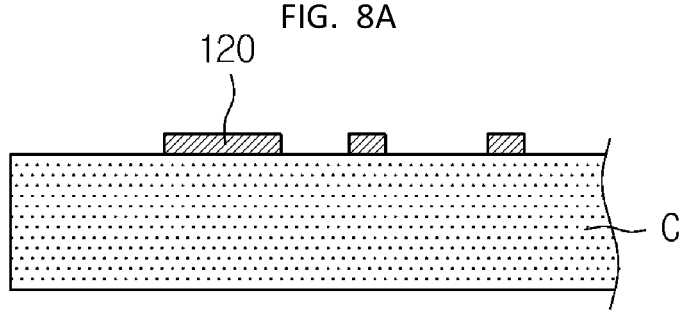
FIGS. 8A to 8E illustrate cross-sectional views illustrating an example of a process of forming one unit substrate according to the method shown in FIG. 7.
Figure 8B:
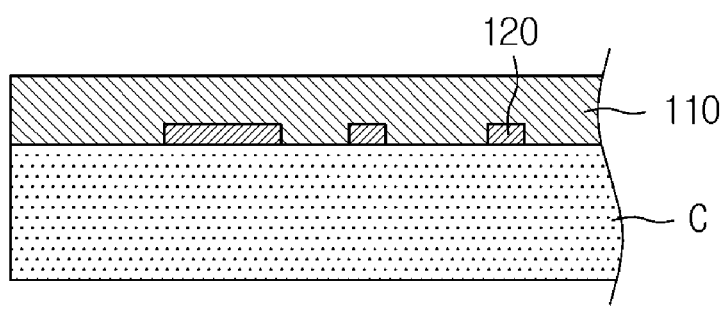
Figure 8C:
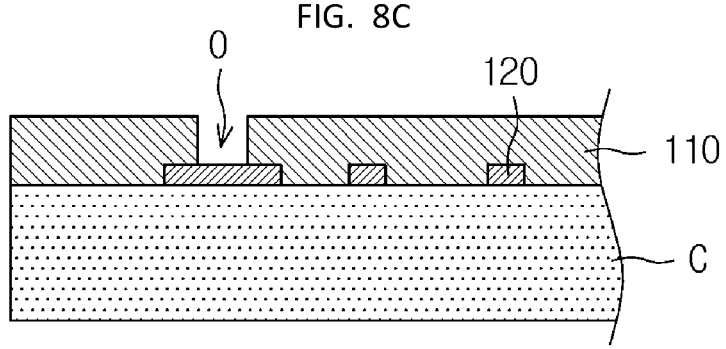
Figure 8D:
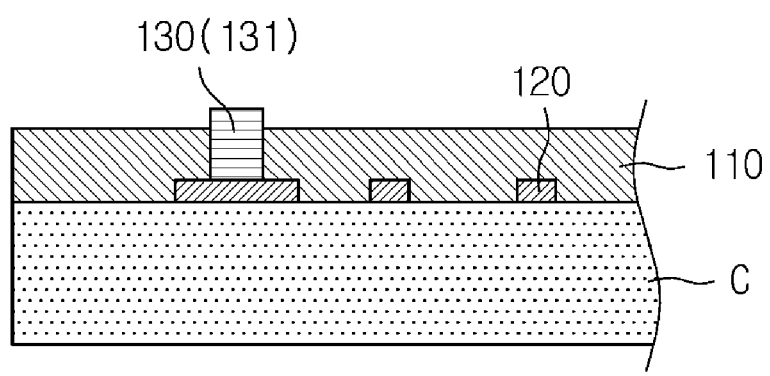
Figure 8E:
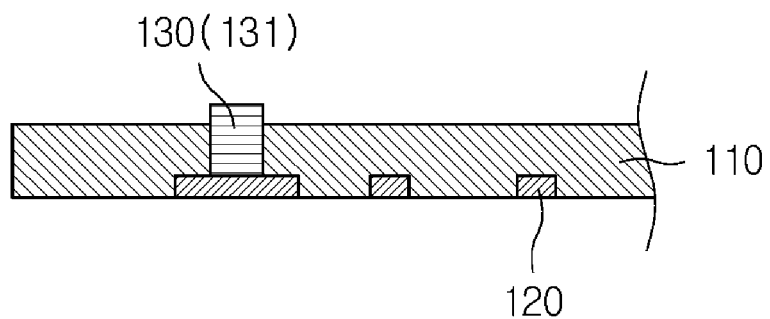
Figure 9A:
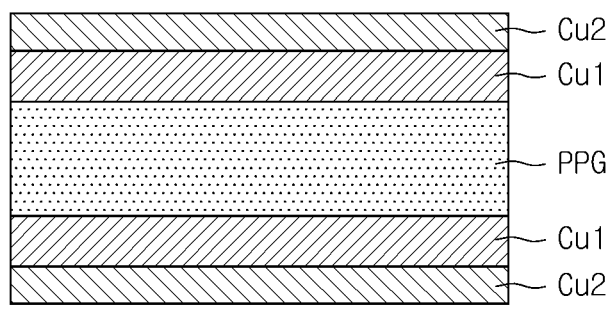
FIGS. 9A to 9B illustrate cross-sectional views of an example of a carrier and a conductive pattern formed thereon that may be used in the process shown in FIGS. 8A to 8E.
Figure 10A:
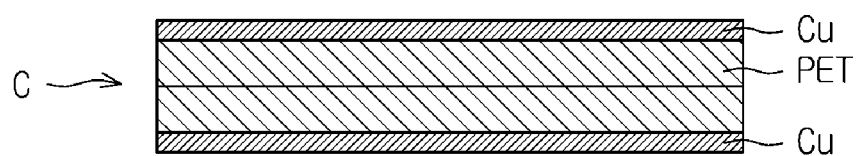
FIGS. 10A and 10B illustrate cross-sectional views of another example of a carrier and a conductive pattern formed thereon that may be used in the process shown in FIGS. 8A to 8E.

FIGS. 8A to 8E illustrate an example of a process of forming one of the plurality of unit substrates by showing a cross-section of a unit substrate, and FIGS. 9A and 10A illustrate examples of carriers that may be used in the process shown in FIGS. 8A to 8E.

Referring to FIG. 8A, a conductive pattern 120 is formed on a carrier C. The conductive pattern C may be formed on both surfaces of the carrier C. In FIG. 8A, the conductive pattern 120 is formed on one surface of the carrier C only. This, however, does not exclude the possibility of having the conductive pattern 120 formed on both surfaces of a carrier.

The conductive pattern 120 may be formed using, but not limited to, at least one of various processes such as, for example, an additive process, a subtractive process, a semi-additive process, a tenting process and a modified semi-additive process.

Figure 9B:
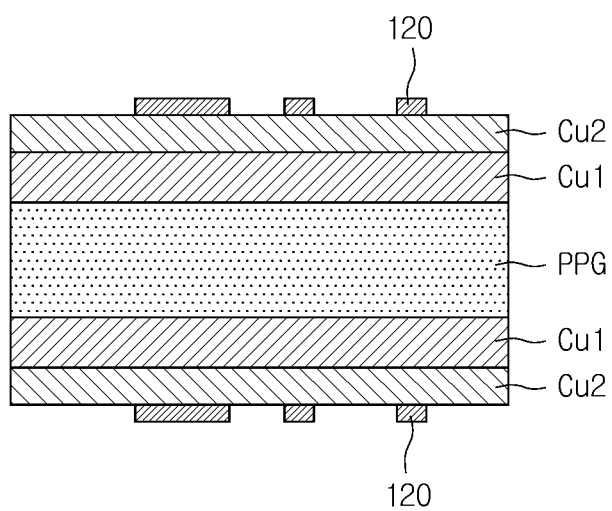

Referring to FIGS. 9A and 9B, a carrier C includes a prepreg PPG, a first copper foil Cu1 and a second copper foil Cu2 laminated successively therein. In this example, the first copper foil Cu1 is formed on both surfaces of the prepreg PPG, and the second copper foil Cu2 is formed on the first copper foil Cu1.

The first copper foil Cu1 and the second copper foil Cu2 are joined with each other by an adhesive layer (not shown). The adhesive layer may be, for example, a tape. The first copper foil Cu1 may be thicker than the second copper foil Cu2. For example, the first copper foil Cu1 may have a thickness between about 12 μm and 18 μm, and the second copper foil Cu2 may have a thickness between about 2 μm and 5 μm.

Because the first copper foil Cu1 and the second copper foil Cu2 might be separated from each other if liquid penetration occurred at an interface between the first copper foil Cu1 and the second copper foil Cu2, an anti-liquid penetration treatment may be made on the first copper foil Cu1 and the second copper foil Cu2.

The second copper foil Cu2 is used as a seed layer for forming the conductive pattern 120. In this example, the conductive pattern 120 may be formed by electroplating the seed layer.

In an example in which the conductive pattern 120 is formed by using a modified semi-additive process, the conductive pattern 120 may be formed by laminating a dry film on the second copper foil Cu2, partially removing the dry film through selective exposure and developing processes, and then plating the removed portions.

When the carrier C is removed, a boundary between the first copper foil Cu1 and the second copper foil Cu2 is widened by the adhesive layer. Afterwards, the second copper foil Cu2 is removed through an etching process.

Figure 10B:
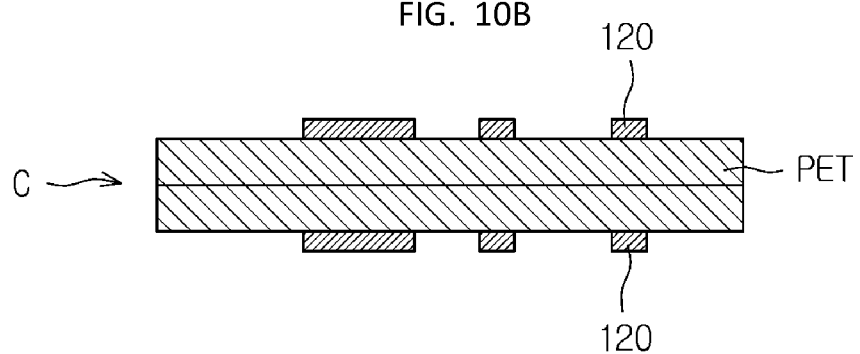

Referring to FIGS. 10A and 10B, the carrier C may include a PET film. In the process of forming the conductive pattern 120, a raw material having a copper foil Cu laminated on the PET film is used, the copper foil Cu possibly having a thickness between about 12 μm and 18 μm.

The copper foil Cu becomes the conductive pattern 120 through a subtractive process or a tenting process. By using the subtractive process or the tenting process, the copper foil Cu is patterned through etching. Moreover, by forming the conductive pattern 120 using the subtractive process or the tenting process, it is possible to reduce a thickness deviation of the conductive pattern 120.

Referring to FIG. 8B, after the conductive pattern 120 is formed on the carrier C, the photosensitive insulating layer 110 is formed. The photosensitive insulating layer 110 may include a photocurable resin. Moreover, an inorganic filler may be contained in the resin to control the rigidity of the photosensitive insulating layer 110.

The photosensitive insulating layer 110 covers the conductive pattern 120 entirely. The photosensitive insulating layer 110 may be laminated on the carrier C by use of a vacuum laminator. However, since the laminated photosensitive insulating layer 110 is not post-cured in the process of forming the unit substrate 10, the photosensitive insulating layer 110 remains in a semi-hardened state (B-stage).

If the photosensitive insulating layer 110 were fully hardened (C-stage), the photosensitive insulating layer 110 would have no flow or tackiness, making it difficult to laminate the unit substrates 10 en bloc.

By laminating the photosensitive insulating layer 110 en bloc in B-stage, adhesion between the photosensitive insulating layers is improved, making it easier to laminate the unit substrates 10 en bloc.

Referring to FIG. 8C, an opening O is formed in the photosensitive insulating layer 110. The opening O may be formed at a portion where the bump 130 is to be formed, by selectively exposing and developing the photosensitive insulating layer 110.

Although the photosensitive insulating layer 110 is given the exposure process, the photosensitive insulating layer 110 may still remain in B-stage with a hardness of, for example, about 10 to 20%. Meanwhile, if necessary, the photosensitive insulating layer 110 may be semi-hardened to have the hardness of about 50% through an additional process. The additional semi-hardening process may be carried out using UV rays used for a photolithography process for forming the opening O. Yet, the photosensitive insulating layer 110 is not fully hardened until the en bloc lamination is made. In other words, the photosensitive insulating layer 110 stays in B-stage when the en bloc lamination is carried out.

Referring to FIG. 8D, the bump 130 is formed in the opening O of the photosensitive insulating layer 110. In this example, the bump 130 may be formed by inserting solder paste P into the opening O and then drying the inserted solder paste P.

The solder paste P may be made of tin, silver, copper or an alloy of metals selected from tin, silver and copper. Moreover, in this example, the solder paste may not contain flux.

The solder paste may be a sintering type, which is hardened at a relatively high temperature, for example, 800° C., or a hardening type, which is hardened at a relatively low temperature, for example, 200° C. In this example, the solder paste P may be a hardening type.

The solder paste P may have a relatively high viscosity, and the shape of the solder paste P may be maintained when the solder paste P is inserted into the opening O. Moreover, the solder paste P may have solder particles therein, and owing to these solder particles, the surface of the solder paste P inserted into the opening O may be rough.

Meanwhile, the solder paste P may be hot-air dried, if necessary, to keep the shape thereof more stably.

Referring to FIG. 8D, the bump 130 formed as described above protrudes outward from the photosensitive insulating layer 110. However, in another example, it is also possible that an upper surface of the bump 130 is on a same plane as an upper surface of the photosensitive insulating layer 110, unlike the example illustrated in FIG. 8D.

Referring to FIG. 8D, the upper surface of the bump 130 may be flat, but the shape of the upper surface of the bump 130 is not restricted what is illustrated herein. In another example, the upper surface of the bump 130 may be curved so as to bulge out from the surface of the photosensitive insulating layer 110. Alternatively, the upper surface of the bump 130 may be mostly flat but curved at an edge thereof.

Referring to FIG. 8E, the carrier C is removed from the unit substrate 10. As described above, the carrier C may be the prepreg PPG, the first copper foil Cu1 and the second copper foil Cu2 or may be the PET film.

In the case where the carrier C is constituted with the prepreg PPG, the first copper foil Cu1 and the second copper foil Cu2, the prepreg PPG and the first copper foil Cu1 are removed first, as described above, and then the second copper foil Cu2 is removed through an additional process, such as etching.

In the case where the carrier C is the PET film, the unit substrate 10 shown in FIG. 8E is prepared by simply removing the PET film.

The photosensitive insulating layer 110 of the unit substrate 10 formed as described above is in B-stage, rather than in C-stage, with the hardness of about 10 to 50%.

Hereinafter, the process of laminating the plurality of unit substrates together will be described.

Figure 11A:
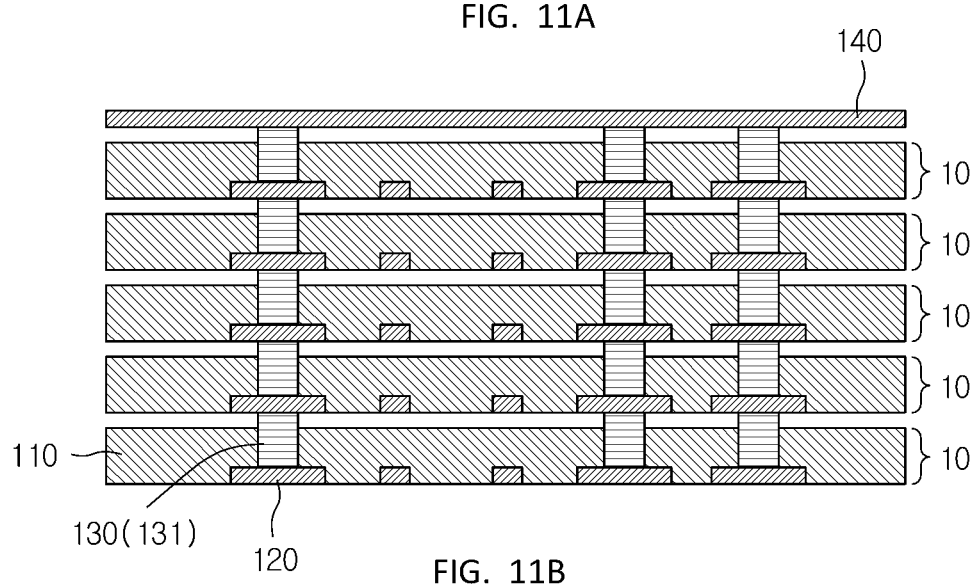
FIGS. 11A to 11B illustrate cross-sectional views of an example of a process of laminating unit substrates together in the flow diagram shown in FIG. 7.
Figure 11B:
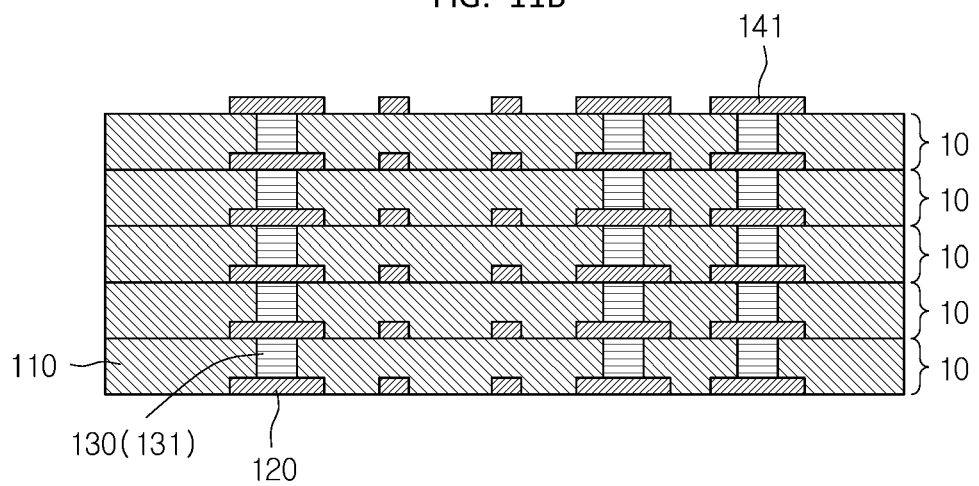

FIGS. 11A and 11B illustrate an example of a process of laminating a plurality of unit substrates together according to the flow diagram of FIG. 7.

Referring to FIGS. 11A and 11B, the process of laminating the unit substrates 10 together may involve arranging the plurality of unit substrates on top of each other in a vertical alignment, disposing a first metal layer 140 on an uppermost layer, and laminating the plurality of unit substrates 10 and the first metal layer 140 together at once to form a laminated structure.

When laminating the plurality of unit substrates 10 together into a laminated structure, an alignment mark may be used to align each of the unit substrates 10. A V-Press laminator may be used to hot press and bond every layer en bloc.

According to one example, during the en bloc lamination, the temperature may be set to approximately 180 to 200° C., and the pressure may be set to approximately 30 to 50 kg/cm$^2$. The temperature and pressure for lamination may be set differently based on a composition of the photosensitive insulating layer 110 and a composition of the solder layer 131. For example, the temperature for performing the lamination may be set to be higher than a melting point of the solder layer 131 of the bump 130.

During the lamination, the solder of the solder layer 131 may be melted and spread radially by a predetermined distance by a pressure applied by a lower surface of a neighboring unit substrate, allowing the conductive members of every layer to be joined with one another. For example, a solder layer 131 may be joined with a conductive pattern 120 of a neighboring unit substrate. In this example, due to the spreading of the solder layer 131 of the bump 130 after the lamination, a cross-sectional area of an upper portion of the bump 130 may be greater than that of a lower portion of the bump 130.

Moreover, the photosensitive insulating layers 110, which have been in the semi-hardened state, are fully hardened after the lamination. Moreover, the bumps 130 are fully hardened.

The first metal layer 140 becomes the source of a first metal pattern 141. For example, after the unit substrates 10 and the first metal layer 140 are laminated en bloc, the first metal layer 140 is patterned to the first metal pattern 141. In this example, the first metal pattern 141 may be formed on the bump 130 and may be protruded from the photosensitive insulating layer 110.

Figure 12:
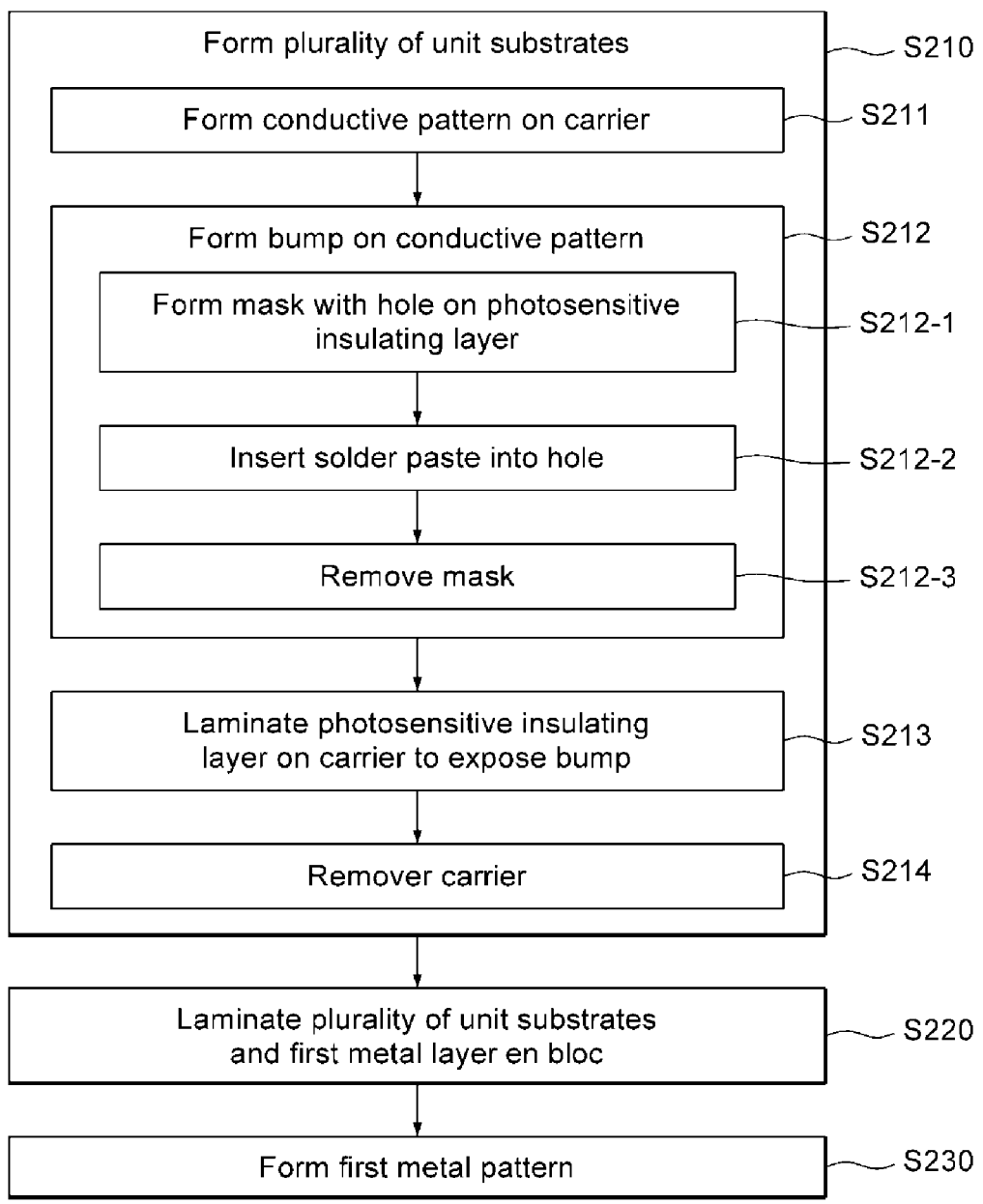
FIG. 12 is a flow diagram illustrating another example of a method of manufacturing a multilayered substrate.

FIG. 12 is a flow diagram illustrating another example of a method of manufacturing a multilayered substrate.

Referring to FIG. 12, the method of manufacturing a multilayered substrate involves forming a plurality of unit substrates (S210) and laminating the plurality of unit substrates en bloc, and the process of laminating the plurality of units substrates en bloc includes laminating the plurality of unit substrates and a first metal layer en bloc (S220). Moreover, the example of the method of manufacturing a multilayered substrate according to FIG. 12 further involves forming a first metal pattern by patterning the first metal layer (S230).

The process of forming a plurality of unit substrates (S210) involves forming a conductive pattern on a carrier (S211), forming a bump on the conductive pattern (S212), laminating a photosensitive insulating layer on the carrier so as to allow the bump to be exposed (S213) and removing the carrier (S214).

The process of forming the bump on the conductive pattern (S212) involves forming a mask having a hole formed therein on the conductive pattern (S212-1), inserting solder paste into the hole (S212-2) and removing the mask (S212-3).

Hereinafter, a process of forming a plurality of unit substrates (S210) will be described.

FIGS. 13A to 13D illustrate an example of a process of forming one of the plurality of unit substrates by showing cross-sectional views of the unit substrate.

Figure 13A:
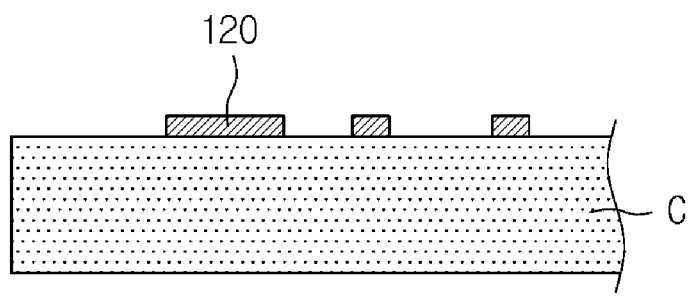
FIGS. 13A to 13B illustrate cross-sectional views of an example of a process of forming one unit substrate according to the method shown in FIG. 12.

Referring to FIG. 13A, a conductive pattern 120 is formed on a carrier C, as described above with reference to FIGS. 7, 9A, 9B, 10A and 10B.

Figure 13B:
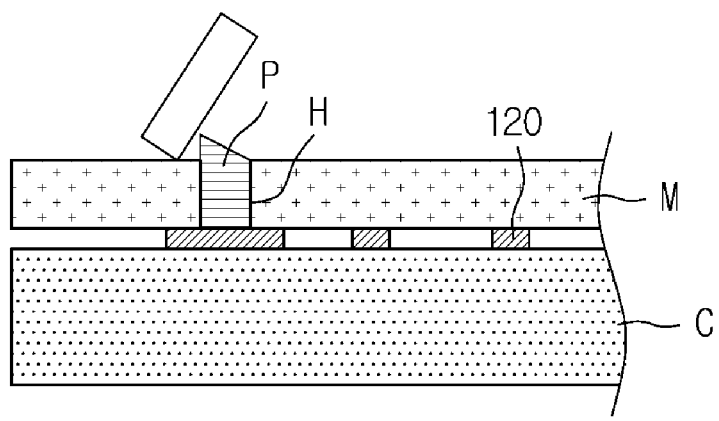
Figure 13C:
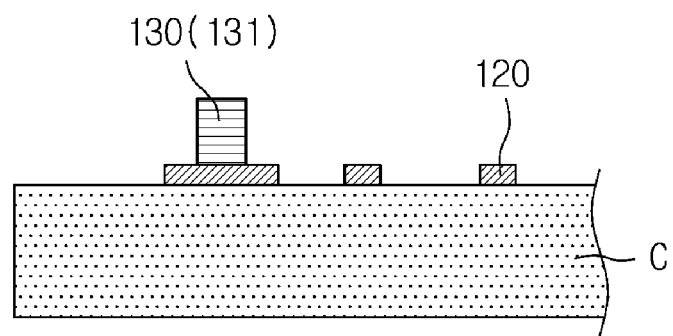

While the photosensitive insulating layer is formed before the bump 130 in the example of the method of manufacturing a multilayered substrate in accordance with FIG. 7, a bump 130 is formed before a photosensitive insulating layer 110 in the example of the method illustrated in FIGS. 12, 13B and 13C. Moreover, a metal mask printing (MMP) process may be used in the method of manufacturing a multilayered substrate according to FIGS. 12 and 13B.

Referring to FIG. 13B, a mask M having a hole H formed therein is disposed on the conductive pattern 120, and solder paste P is inserted into the hole H.

The hole H of the mask M may be pre-formed based on a location where the bump 130 is to be formed. The mask M may be made of a metallic material.

After the mask M is disposed on the conductive pattern 120, the solder paste P may be squeezed into the hole H.

Referring to FIG. 13C, the mask M is removed. The solder paste P may have a relatively high viscosity, and the shape of the solder paste P may be maintained on the conductive pattern 120 even after the mask M is removed.

The solder paste P may be made of tin, silver, copper or an alloy of metals selected from tin, silver and copper, and the surface of the bump 130 formed with the solder paste P may be rough.

Figure 13D:
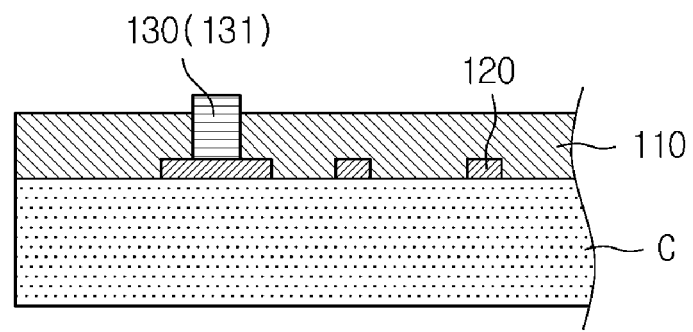

Referring to FIG. 13D, the photosensitive insulating layer 110 is laminated on the carrier C, and the bump 130 is exposed from the photosensitive insulating layer 110, with an upper surface of the bump 130 protruding above an upper surface of the photosensitive insulating layer 110.

The unit substrate is prepared when the carrier C is removed after processes illustrated in FIGS. 13A to 13D. The unit substrate is provided in plurality, and the plurality of unit substrates and a first metal layer 140 are laminated together. After the plurality of unit substrates and the first metal layer 140 are laminated together, the first metal layer 140 may be patterned to a first metal pattern 141.

The process of lamination is identical with the process described above with reference to FIGS. 11A and 11B and thus will not be described redundantly herein.

Figure 14:
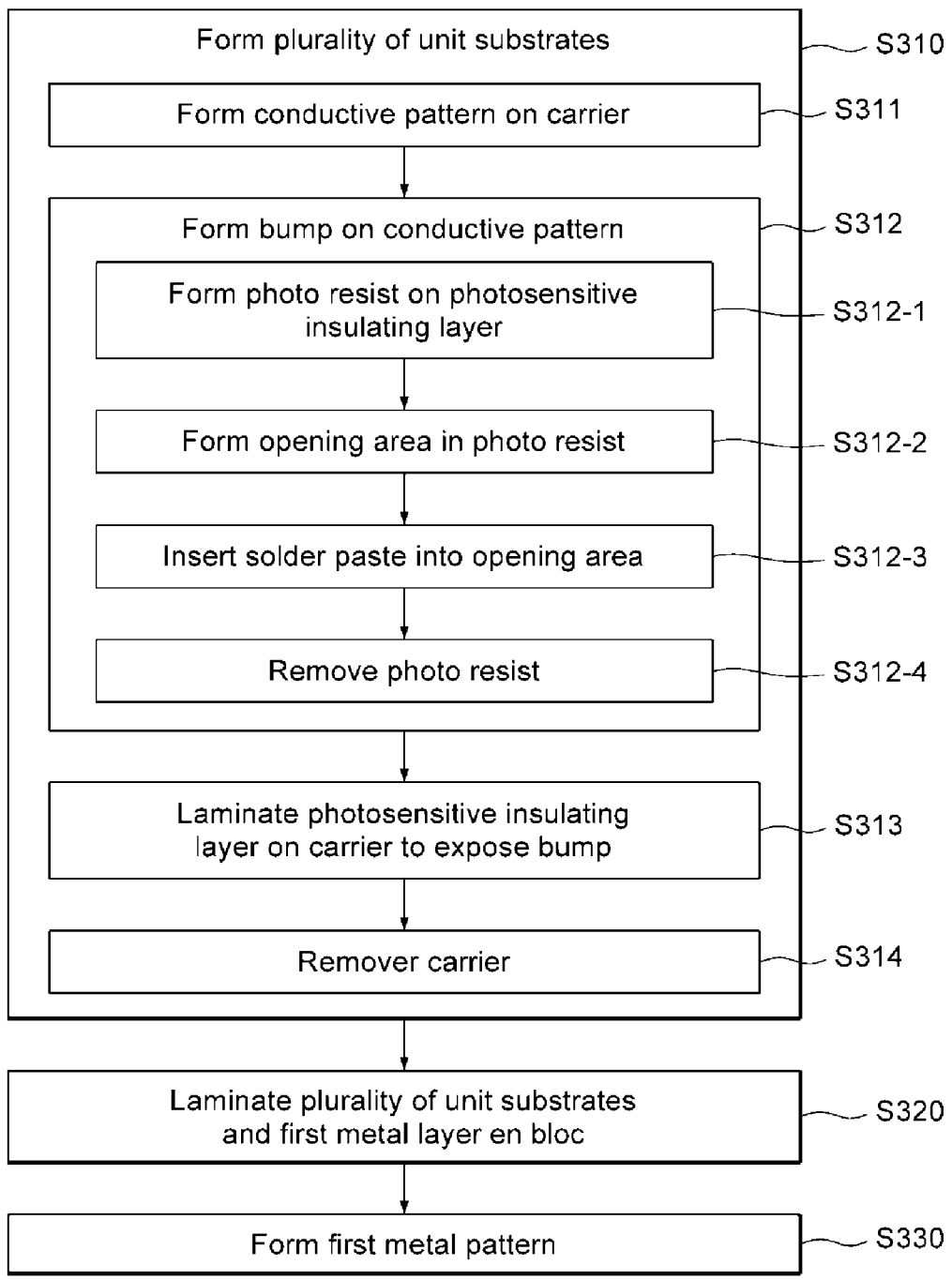
FIG. 14 is a flow diagram illustrating another example of a method of manufacturing a multilayered substrate.

FIG. 14 is a flow diagram illustrating another example of a method of manufacturing a multilayered substrate.

Referring to FIG. 14, the method of manufacturing a multilayered substrate involves forming a plurality of unit substrates (S310) and laminating the plurality of unit substrates en bloc, and the process of laminating the plurality of units substrates en bloc includes laminating the plurality of unit substrates and a first metal layer en bloc (S320). Moreover, the method of manufacturing a multilayered substrate further involves forming a first metal pattern by patterning the first metal layer (S330).

The process of forming a plurality of unit substrates (S310) involves forming a conductive pattern on a carrier (S311), forming a bump on the conductive pattern (S312), laminating a photosensitive insulating layer on the carrier so as to allow the bump to be exposed (S313) and removing the carrier (S314).

The process of forming the bump on the conductive pattern (S312) involves forming a photo resist on the conductive pattern (S312-1), forming an opening area in the photo resist (S312-2), inserting solder paste into the opening area (S312-3) and removing the photo resist (S312-4).

Hereinafter, an example of a process of forming a plurality of unit substrates (S310) according to FIG. 14 will be described.

FIGS. 15A to 15E illustrate an example of a process of forming one of the plurality of unit substrates by showing cross-sectional views of a unit substrate.

Figure 15A:
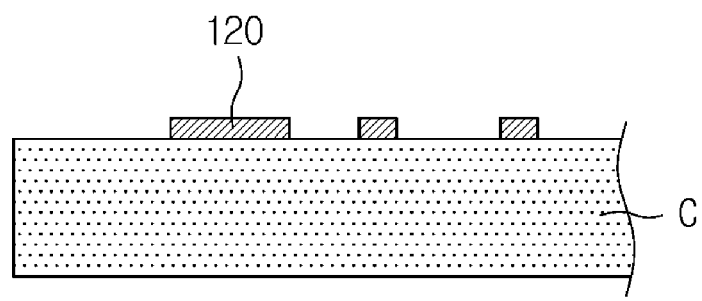
FIGS. 15A to 15E illustrate cross-sectional views of an example of a process of forming one unit substrate according to the method shown in FIG. 14.

Referring to FIG. 15A, a conductive pattern 120 is formed on a carrier C, as described above with reference to FIGS. 7, 9A, 9B, 10A and 10B.

Figure 15B:
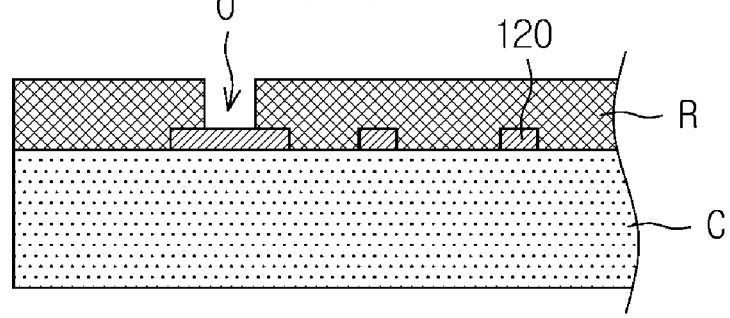
Figure 15C:
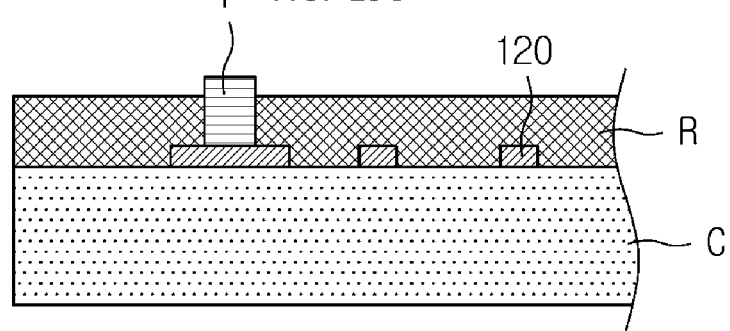

While the photosensitive insulating layer 110 is formed before the bump 130 in the example of the method of manufacturing a multilayered substrate in accordance with FIG. 7, a bump 130 is formed before a photosensitive insulating layer 110 in the example illustrated in FIGS. 14, 15B and 15C. Moreover, a photolithography process is used in this method of manufacturing a multilayered substrate.

Referring to FIG. 15B, a photo resist R is laminated on the carrier C, and an opening area O' is formed in the photo resist R corresponding to a location where the bump 130 is to be formed. The photo resist R may be a dry film.

In this example, the photo resist R may be photosensitive, allowing the photolithography process to be used, and may be exposed and developed to selectively form an opening in the opening area O'.

Referring to FIG. 15C, solder paste P is inserted into the opening area O'.

Figure 15D:
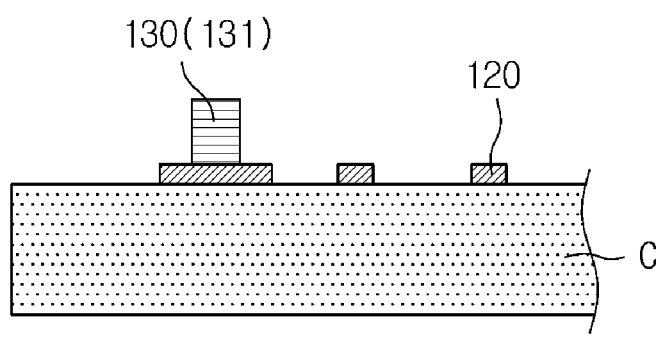

Referring to FIG. 15D, the photo resist R is removed. The photo resist R may be, for example, exfoliated. In this example, it is possible to have the photo resist R removed by a stripper solution, without having other portions of the unit substrate damaged.

Because the solder paste P has a viscosity, the shape of the solder paste P may be maintained even after the photo resist R is removed.

Figure 15E:
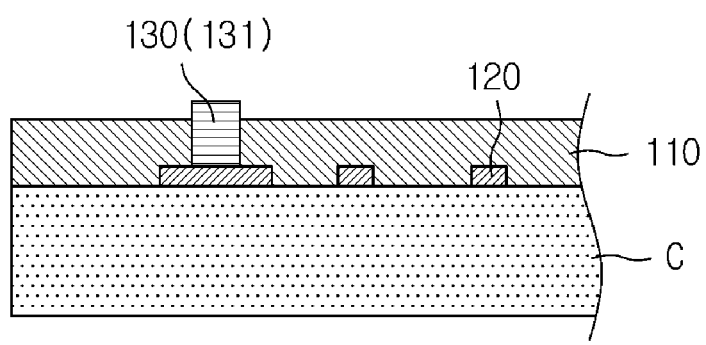

Referring to FIG. 15E, the photosensitive insulating layer 110 is laminated on the carrier C, and the bump 130 is exposed from the photosensitive insulating layer 110, with an upper surface of the bump 130 protruding above an upper surface of the photosensitive insulating layer 110.

The unit substrate is prepared when the carrier C is removed after processes illustrated in FIGS. 15A to 15E. The unit substrate is provided in plurality, and the plurality of unit substrates and a first metal layer 140 are laminated en bloc. After the plurality of unit substrates and the first metal layer 140 are laminated en bloc, the first metal layer 140 may be patterned to a first metal pattern 141.

The process of lamination is identical with the process described above with reference to FIGS. 11A and 11B and thus will not be described redundantly herein.

Figure 16:
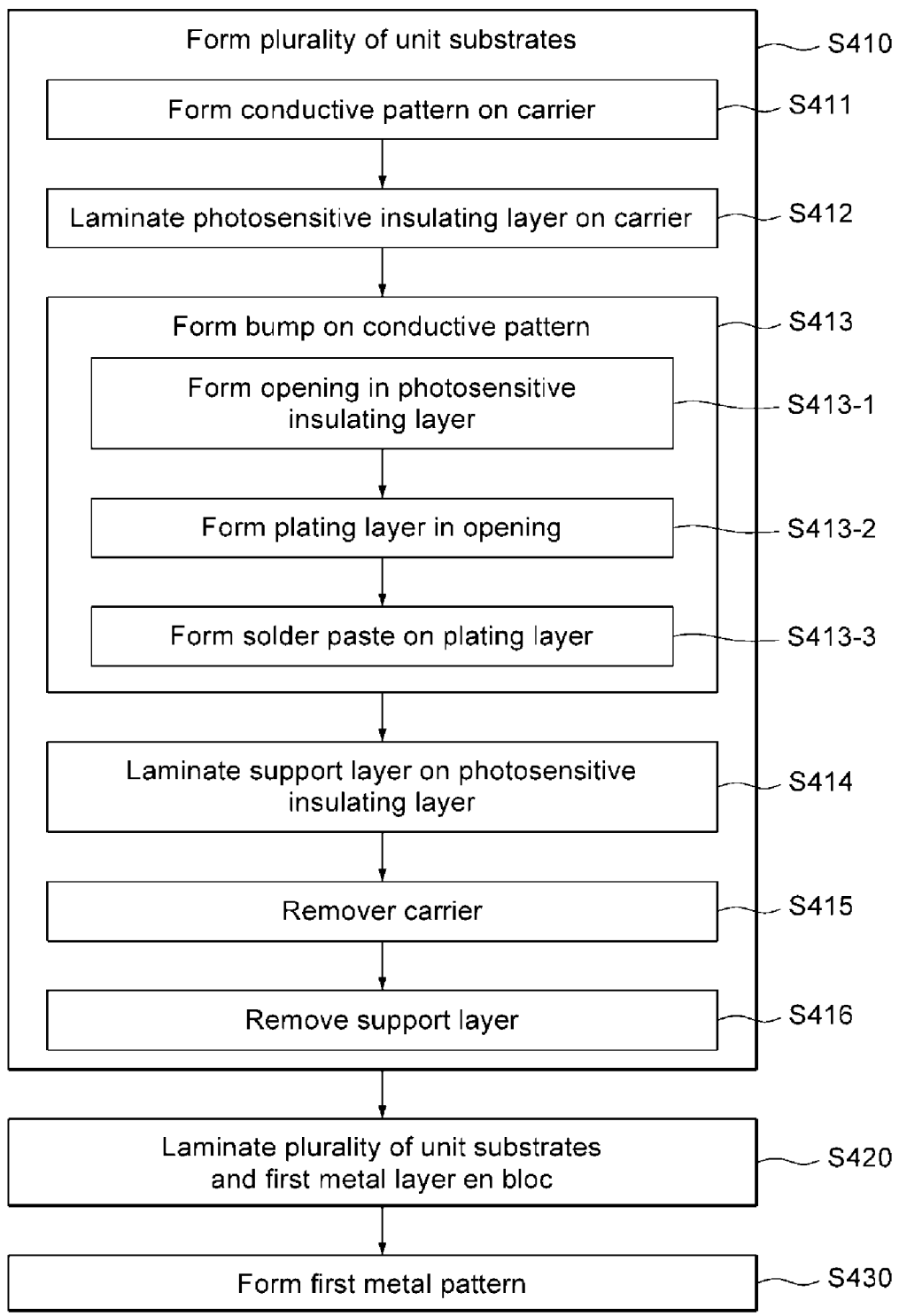
FIG. 16 is a flow diagram illustrating another example of a method of manufacturing a multilayered substrate.

FIG. 16 is a flow diagram illustrating yet another example of a method of manufacturing a multilayered substrate.

Referring to FIG. 16, the method of manufacturing a multilayered substrate involves forming a plurality of unit substrates (S410) and laminating the plurality of unit substrates en bloc, and the process of laminating the plurality of units substrates en bloc includes laminating the plurality of unit substrates and a first metal layer en bloc (S420). Moreover, referring to FIG. 16, the method of manufacturing a multilayered substrate further involves forming a first metal pattern by patterning the first metal layer (S430).

The process of forming a plurality of unit substrates (S410) involves forming a conductive pattern on a carrier (S411), laminating a photosensitive insulating layer on the carrier (S412), forming a bump on the conductive pattern (S413), laminating a support layer on the photosensitive insulating layer (S414) and removing the carrier (S415).

In this example, a bump 130 includes not only a solder layer 131 but also a plated layer, and the process of forming the bump on the conductive pattern (S413) involves forming an opening in the photosensitive insulating layer (S413-1), forming the plated layer in the opening (S413-2) and forming solder paste on the plated layer (413-3).

In this example, the process of forming a plurality of unit substrates (S410) further involves removing the support layer (S416).

Hereinafter, an example of a process of forming a plurality of unit substrates (S410) according to FIG. 16 will be described.

FIGS. 17A to H illustrate an example of a process of forming one of the plurality of unit substrates by showing cross-sectional views of a unit substrate.

Figure 17A:
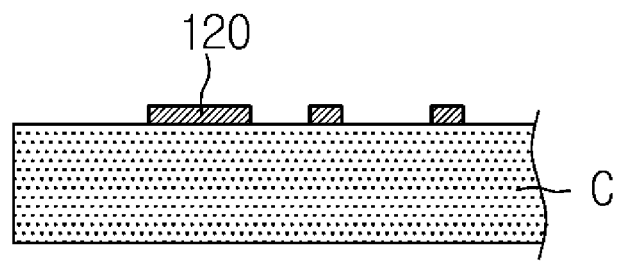
FIGS. 17A to 17H illustrate cross-sectional views of an example of a process of forming one unit substrate according to the method shown in FIG. 16.

Referring to FIG. 17A, a conductive pattern 120 is formed on a carrier C, as described above with reference to FIGS. 7, 9A, 9B, 10A and 10B.

Figure 17B:
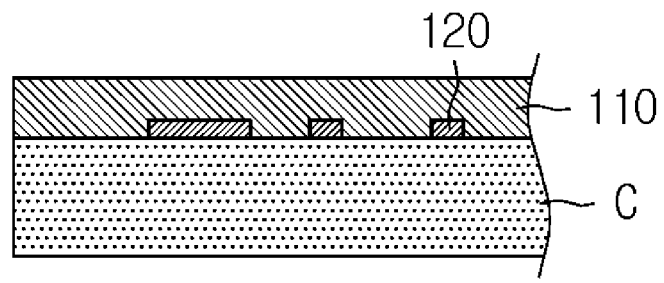

Referring to FIG. 17B, after the conductive pattern 120 is formed on the carrier C, a photosensitive insulating layer 110 is formed. The photosensitive insulating layer 110 may include a photocurable resin. Moreover, an inorganic filler may be contained in the resin to control the rigidity of the photosensitive insulating layer 110.

The photosensitive insulating layer 110 covers the conductive pattern 120 entirely. The photosensitive insulating layer 110 may be laminated on the carrier C by use of a vacuum laminator. However, because the laminated photosensitive insulating layer 110 is not post-cured in the process of forming the unit substrate 10, the photosensitive insulating layer 110 remains in a semi-hardened state (B-stage).

Figure 17C:
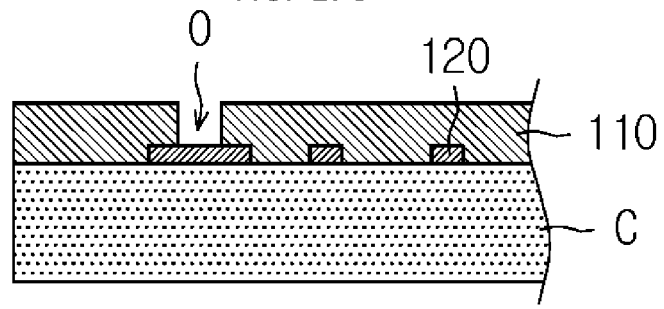

Referring to FIG. 17C, an opening O is formed in the photosensitive insulating layer 110. Because the photosensitive insulating layer 110 has a photosensitive property, it is possible to form the opening O in the photosensitive insulating layer 110 by performing exposure and developing processes without the use of a photo resist. The opening O may be formed at a portion where the bump 130 is to be formed, by selectively exposing and developing the photosensitive insulating layer 110.

Figure 17D:
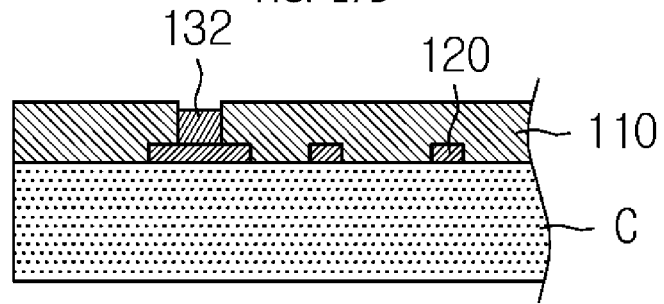

Referring to FIG. 17D, a plated layer is formed in the opening O. In this example, the plated layer may be a copper layer 132.

The copper layer 132 may be electroplated using the conductive pattern 120 as a seed layer, and it is possible to form the copper layer 132 by forming an electroless plated layer first and then forming an electroplated layer above the electroless plated layer.

Although it is illustrated in FIG. 17D that an upper surface of the copper layer 132 is lower than an upper surface of the photosensitive insulating layer 110, it is also possible that the copper layer 132 is formed in such a way that the upper surface of the copper layer 132 is coplanar with the upper surface of the photosensitive insulating layer 110. That is, the height of the upper surface of the copper layer 132 is not restricted to what is illustrated herein.

Figure 17E:
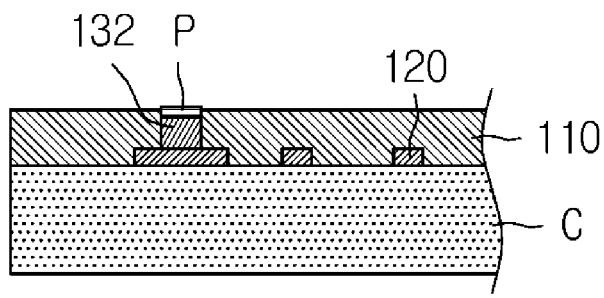

Referring to FIG. 17E, by coating and drying solder paste P on the copper layer 132, a solder layer 131 is prepared. The solder layer 131 may be thinner than the copper layer 132. A surface of the copper layer 132 formed through plating may be relatively smooth, and a surface of the solder layer 131 formed by coating the solder paste P may be relatively rough.

The solder layer 131 may protrude outward from the photosensitive insulating layer 110. A height of protrusion of the solder layer 131 from the photosensitive insulating layer 110 may be 3 µm or less.

Meanwhile, in another example, an upper surface of the solder layer 131 may be coplanar with the upper surface of the photosensitive insulating layer 110. That is, the copper layer 132 may be formed with a smaller height than that of the opening O, and a remaining height of the opening O may be filled by the solder layer 131.

The solder paste P may be hot-air dried, if necessary, and the dried solder paste P may become the solder layer 131. If drying is not required, the solder paste P becomes the solder layer 131 directly.

The copper layer 132 and the solder layer 131 formed as described above become the bump 130.

Figure 17F:
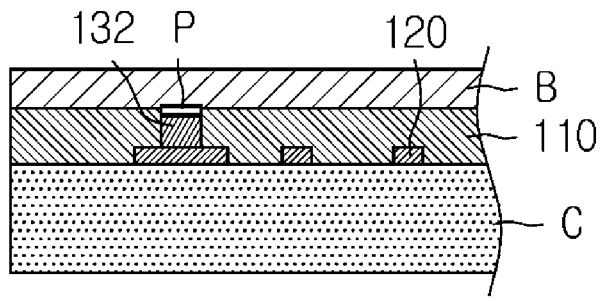

Referring to FIG. 17F, a support layer B is formed on the photosensitive insulating layer 110. The support layer B may cover the solder layer 131 entirely. In an example, the photosensitive insulating layer 110 may have a thickness of about 20 to 60 µm, and the support layer B may have a thickness of about 100 µm or more. That is, by allowing the support layer B to have a greater thickness than the photosensitive insulating layer 110, it is possible for the support layer B to support the photosensitive insulating layer 110. The support layer B may be made of a PET material. The support layer B may be also referred to as a back mask.

The support layer B may be formed as a plurality of layers, in which case the support layer B may consist of a non-adhesive layer and an adhesive layer. The non-adhesive layer makes a direct contact with the solder layer 131, and the adhesive layer makes contact with the non-adhesive layer only but not with the solder layer 131. Meanwhile, coverage of the adhesive layer reaches all the way to a lateral surface of the non-adhesive layer, allowing a lower surface of the adhesive layer to be attached to the photosensitive insulating layer 110. Accordingly, the adhesive layer is attached to the photosensitive insulating layer 110 while encapsulating the non-adhesive layer and the solder layer 131.

Figure 17G:
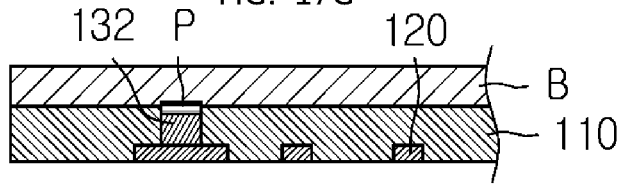

Referring to FIG. 17G, the carrier C is removed. The carrier C may be a prepreg PPG, a first copper foil Cu1 and a second copper foil Cu2 or may be a PET film.

In an example in which a carrier that includes a prepreg PPG, a first copper foil Cu1 and a second copper foil Cu2 is used, the prepreg PPG and the first copper foil Cu1 are removed first, as described above, and then the second copper foil Cu2 is removed through an additional process, such as etching.

In an example in which a carrier that includes a PET film is used, the PET film may be peeled off.

The support layer B remains during the process illustrated in FIG. 17G. That is, while the carrier C is removed, the photosensitive insulating layer 110 may be protected due to the support that the support layer B provides to the photosensitive insulating layer 110.

Figure 17H:
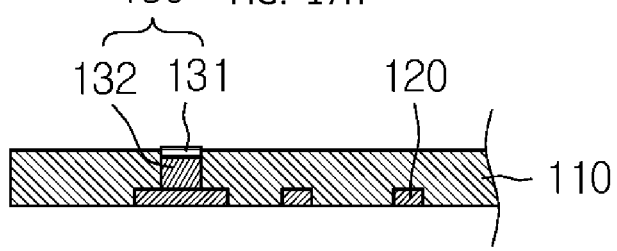

Referring to FIG. 17H, the support layer B is removed. In an example in which the support layer B consists of two layers of the adhesive layer and the non-adhesive layer, slicing an area contacted by the adhesive layer and the photosensitive insulating layer 110 results in separation of the photosensitive insulating layer 110 and the non-adhesive layer from each other.

One unit substrate is prepared through the processes illustrated in FIGS. 17A to 17H. A plurality of unit substrates are each prepared, and the plurality of unit substrates and a first metal layer 140 are laminated together in one lamination process. After the plurality of unit substrates and the first metal layer 140 are laminated together, the first metal layer 140 may be patterned to a first metal pattern 141.

The process of lamination is identical with the process described above with reference to FIGS. 11A and 11B and thus will not be described redundantly herein.

Figure 18:
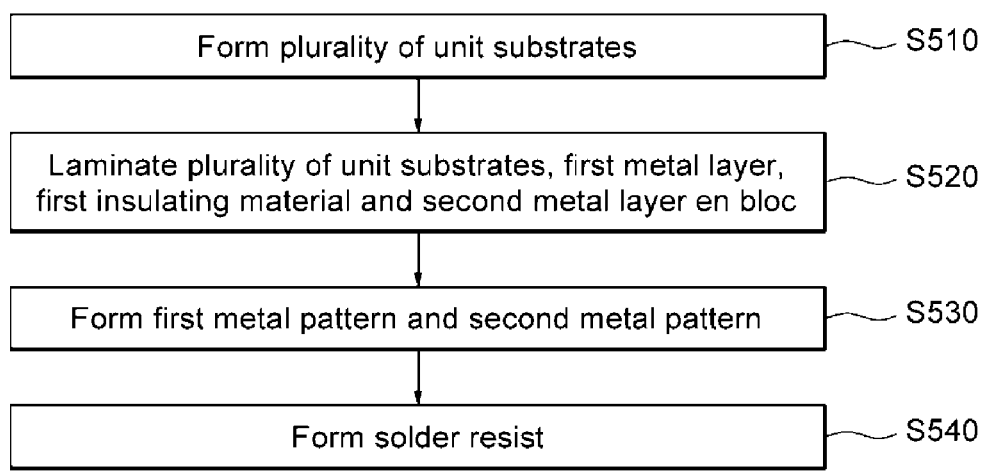
FIG. 18 is a flow diagram illustrating another example of a method of manufacturing a multilayered substrate.

FIG. 18 is a flow diagram illustrating yet another example of a method of manufacturing a multilayered substrate.

Referring to FIG. 18, the method of manufacturing a multilayered substrate involves forming a plurality of unit substrates (S510) and laminating the plurality of unit substrates en bloc, and the process of laminating the plurality of units substrates en bloc includes laminating the plurality of unit substrates, a first metal layer, a first insulating layer and a second metal layer together (S520). In this example, the method of manufacturing a multilayered substrate further involves forming a first metal pattern and a second metal pattern (S530) and forming a solder resist (S540).

In the example of the method of manufacturing a multilayered substrate illustrated in FIG. 18, the process of forming a plurality of unit substrates (S510) may be borrowed from the process of "forming a plurality of unit substrates" described with respect to FIGS. 7 to 17H.

Accordingly, the process of forming a plurality of unit substrates (S510) will not be described redundantly herein, and the process of laminating the plurality of unit substrates en bloc will be described hereinafter.

Figure 19A:
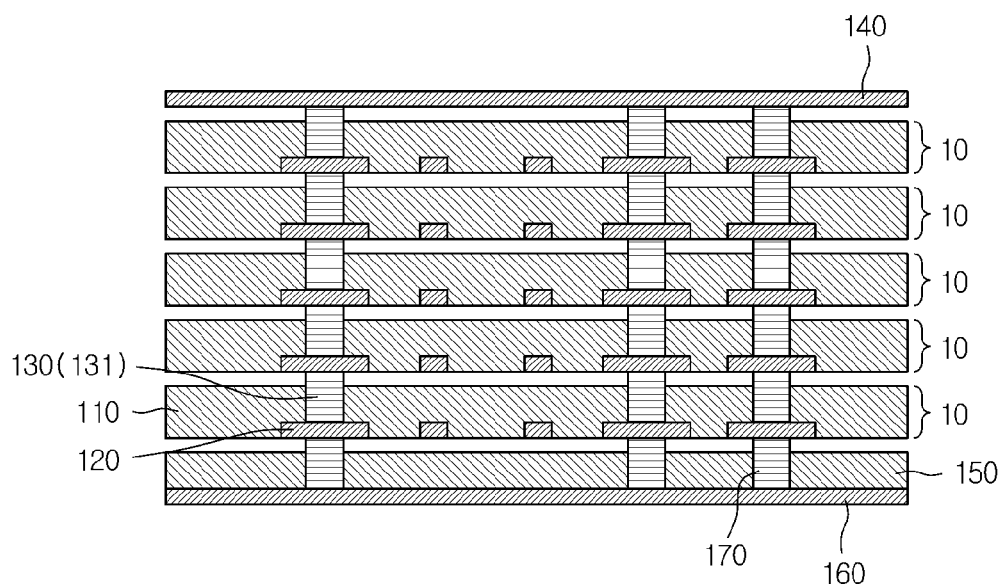
FIGS. 19A to 19C illustrate cross-sectional views of an example of a process of laminating unit substrates together according to the method shown in FIG. 18.
Figure 19B:
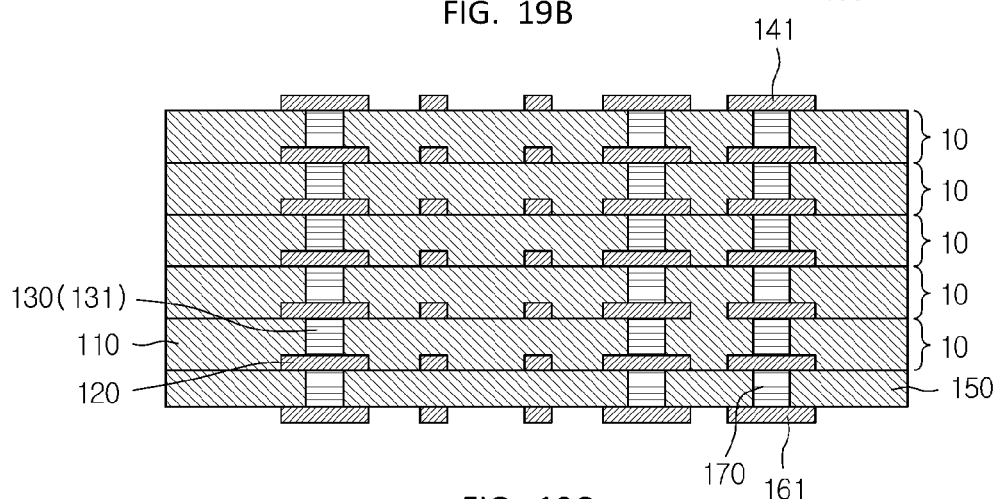
Figure 19C:
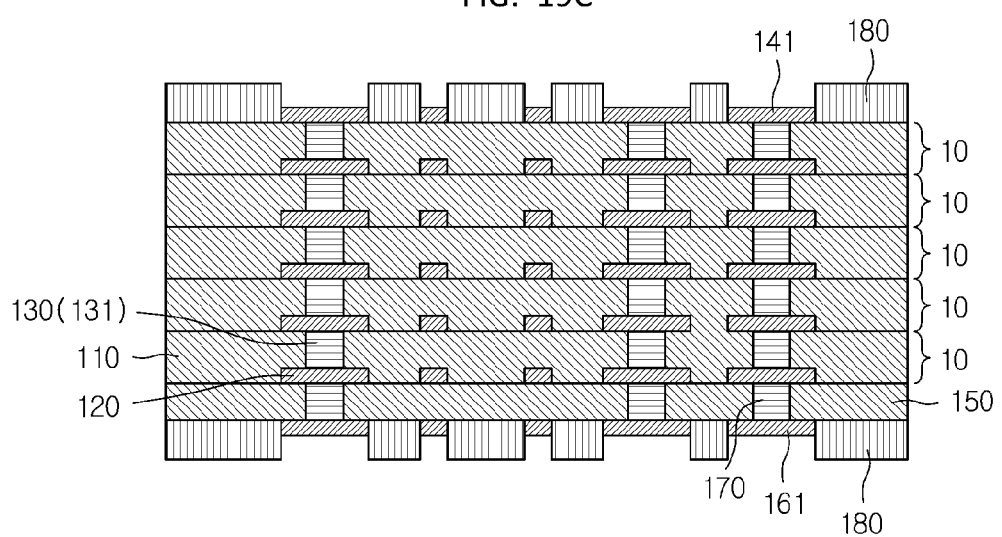

FIGS. 19A to 19C illustrate an example of a process of laminating unit substrates en bloc, as shown in the flow diagram of FIG. 18.

Referring to FIGS. 19A to 19C, in the method of manufacturing a multilayered substrate, the process of laminating the plurality of units substrates en bloc involves laminating the plurality of unit substrates, a first metal layer, a first insulating layer and a second metal layer en bloc (S520).

Referring to FIGS. 19A to 19C, after arranging a plurality of unit substrates 10 above and below one another, a first metal layer 140 on an uppermost layer of the plurality of unit substrates 10, a first insulating layer 150 on a lowermost layer of the plurality of unit substrates 10, and a second metal layer 160 below the first insulating layer 150, the plurality of unit substrates 10, the first metal layer 140, the first insulating layer 150 and the second metal layer 160 are laminated en bloc to form a laminated structure in which the unit substrates 10 are adhered to one another.

The first insulating layer 150 has a via 170 formed therein. The via 170 may be made of a same material as that of a bump 130. The first insulating layer 150 and the via 170 may be prepared through same processes as those for forming a photosensitive insulating layer 110 and the bump 130, except that the first insulating layer 150 does not have a conductive pattern 120 buried therein but has a second metal pattern 161 formed on a lower surface thereof.

After the lamination, the first metal layer 140 is patterned to a first metal pattern 141, and the second metal layer 160 is patterned to the second metal pattern 161.

After the first metal pattern 141 and the second metal pattern 161 are formed, a solder resist 180 may be formed above the first metal pattern 141 and the second metal pattern 161.

Figure 20:
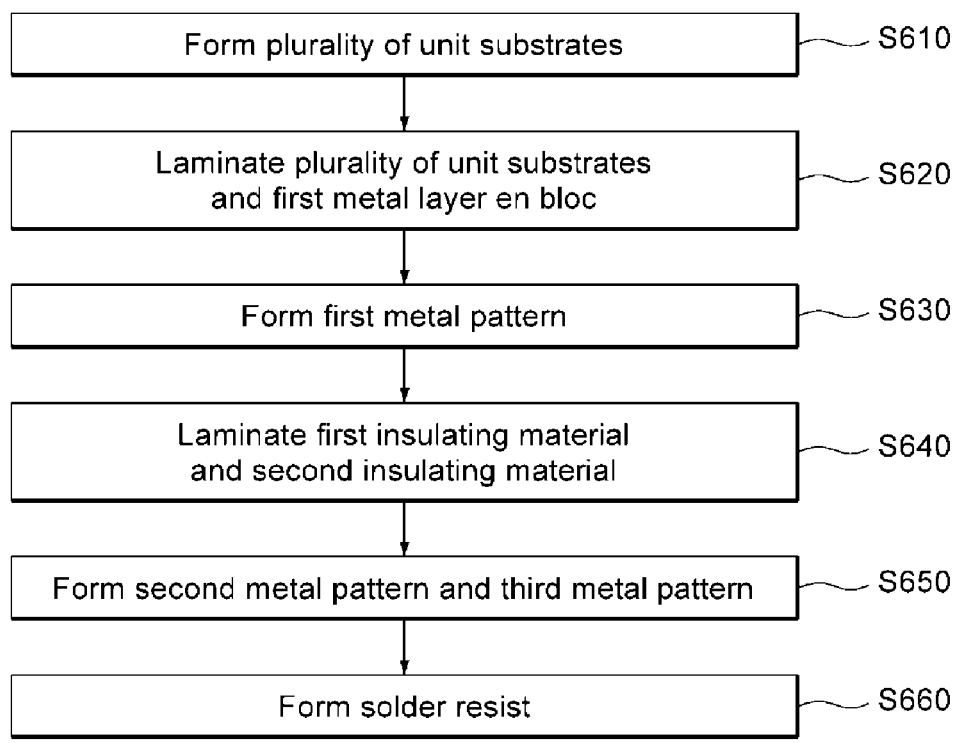
FIG. 20 is a flow diagram illustrating yet another example of a method of manufacturing a multilayered substrate.

FIG. 20 is a flow diagram illustrating yet another example of a method of manufacturing a multilayered substrate.

Referring to FIG. 20, the method of manufacturing a multilayered substrate involves forming a plurality of unit substrates (S610) and laminating the plurality of unit substrates en bloc. In this example, the lamination process involves laminating the plurality of unit substrates together with a first metal layer en bloc (S620). The method of manufacturing a multilayered substrate in accordance with FIG. 20 further involves forming a first metal pattern (S630), laminating a first insulating layer and a second insulating layer (S640), forming a second metal pattern and a third metal pattern (S650) and forming a solder resist (S660).

In the example of the method of manufacturing a multilayered substrate illustrated in FIG. 20, the process of forming a plurality of unit substrates (S610) may be borrowed from the process of forming a plurality of unit substrates described in other examples of methods of manufacturing a multilayered substrate.

Accordingly, the process of forming a plurality of unit substrates (S610) will not be described redundantly herein, and the process of laminating the plurality of unit substrates en bloc will be described hereinafter.

Figure 21A:
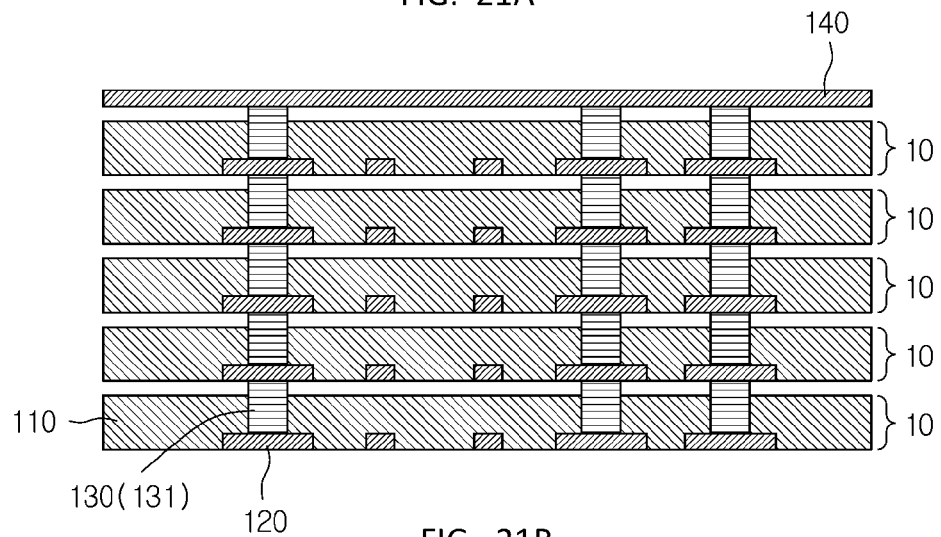
FIGS. 21A to 21C illustrate cross-sectional views of an example of a process of laminating unit substrates together according to the method shown in FIG. 20.
Figure 21B:
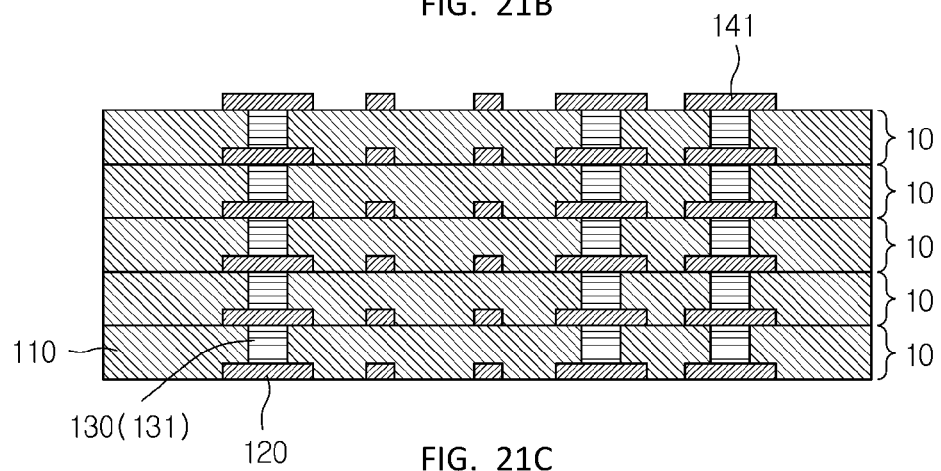
Figure 21C:
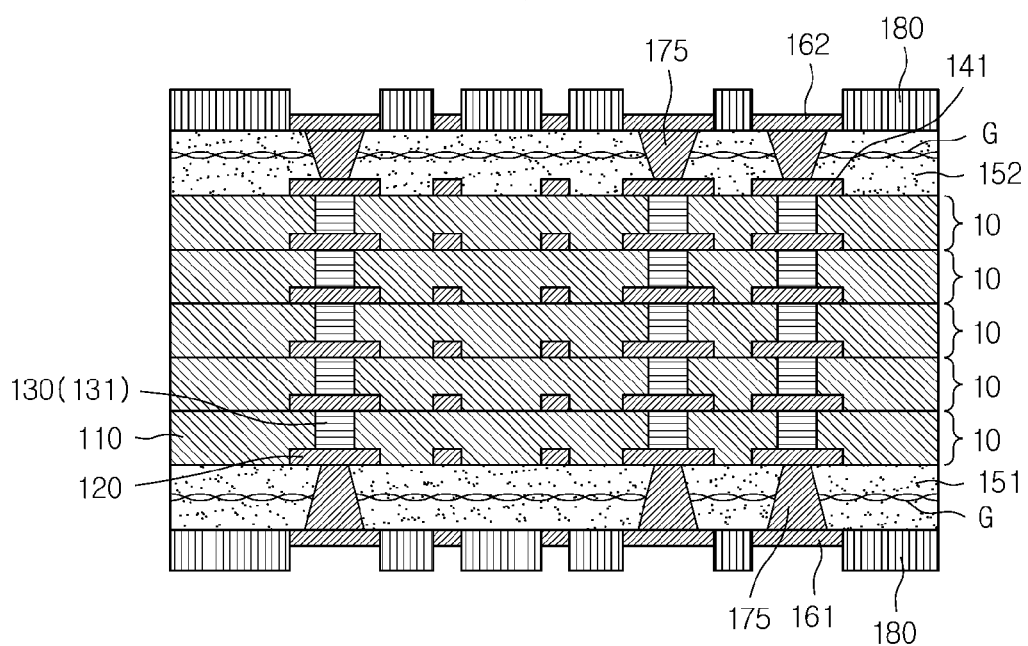

FIGS. 21A to 21C illustrate an example of a process of laminating unit substrates en bloc, as listed in the flow diagram shown in FIG. 20, by showing cross-sections of the unit substrates.

In this example of a method of manufacturing a multilayered substrate, the process of laminating the plurality of units substrates together is performed by arranging the plurality of unit substrates 10 above and below one another, arranging a first metal layer 140 on an uppermost layer of the plurality of unit substrates 10 and then laminating the plurality of unit substrates 10 and the first metal layer 140 together.

After the lamination, the first metal layer 140 is patterned to a first metal pattern 141.

Afterwards, a first insulating layer 151 and a second insulating layer 152 are laminated on a lowermost layer and an uppermost layer, respectively, of the laminated substrates 10 and first metal pattern 141, and via holes are formed, respectively, in the first insulating layer 151 and the second insulating layer 152, and then the via holes are plated to form the vias 175.

Thereafter, a second metal pattern 161 is formed on the first insulating layer 151, and a third metal pattern 162 is formed on the second insulating layer 152, and then a solder resist 180 is formed on the second metal pattern 161 and the third metal pattern 162.

In this example, the first insulating layer 151 and the second insulating layer 152 may be made of a resin having a fiber stiffener impregnated therein. That is, the first insulating layer 151 and the second insulating layer 152 may be a prepreg. In this example, the via hole may be machined using a YAG laser or a $CO_2$ laser, and the via 175 formed by the via hole may have a shape that is distinguishable from that of a bump 130.

In this example, a latitudinal cross-sectional area of the via 175 may be decreased toward an inside of the multilayered substrate while the bump 130 has a constant cross-sectional area.

The fiber stiffener of the first insulating layer 151 and the second insulating layer 152 may provide rigidity to the multilayered substrate, for example, a similar rigidity as if a reinforcing core were disposed in the middle of the multilayered substrate, although the first insulating layer 151 and the second insulating layer 152 are disposed on outermost layers of the multilayered substrate.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayered substrate comprising a plurality of unit substrates laminated in a direction of thickness thereof,
   wherein the unit substrates each comprise:
      a photosensitive insulating layer;
      a conductive pattern embedded in the photosensitive insulating layer and having one surface thereof exposed through one surface of the photosensitive insulating layer; and
      a bump penetrating into the photosensitive insulating layer and providing an interlayer connection to the conductive pattern, and
   wherein the bump comprises:
      a copper layer making contact with the conductive pattern of one of the unit substrates; and
      a solder layer formed on the copper layer and making contact with the conductive pattern of another of the unit substrates.

2. The multilayered substrate of claim 1, further comprising:
   a first metal pattern disposed above an uppermost unit substrate of the unit substrates;
   a first insulating layer laminated below a lowermost unit substrate of the unit substrates;
   a second metal pattern disposed on a lower surface of the first insulating layer; and
   a via disposed in the first insulating layer and connecting the conductive pattern of the lowermost unit substrate of the unit substrates with the second metal pattern.

3. The multilayered substrate of claim 2, wherein the first insulating layer comprises a photosensitive resin, and
   wherein the via and the bump comprise a same material.

4. The multilayered substrate of claim 2, further comprising a solder resist disposed on the first metal pattern and the second metal pattern.

5. The multilayered substrate of claim 2, further comprising:
- a second insulating layer disposed above the uppermost unit substrate and covering the first metal pattern; and
- a third metal pattern disposed on the second insulating layer.

6. The multilayered substrate of claim 5, wherein the first insulating layer and the second insulating layer each comprise a resin impregnated with a fiber stiffener.

7. The multilayered substrate of claim 5, further comprising a solder resist disposed on the second metal pattern or the third metal pattern.

* * * * *